(12) United States Patent
Liao et al.

(10) Patent No.: US 10,499,527 B2
(45) Date of Patent: Dec. 3, 2019

(54) COMPUTER RACK ATTACHMENT

(71) Applicant: Southco, Inc., Concordville, PA (US)

(72) Inventors: Xiaoying Liao, Dongguan (CN); Xuexian Qin, Shenzhen (CN); Richard E. Schlack, Newark, DE (US)

(73) Assignee: SOUTHCO, INC., Concordville, PA (US)

( * ) Notice: Subject to any disclaimer, the term of this patent is extended or adjusted under 35 U.S.C. 154(b) by 144 days.

(21) Appl. No.: 15/891,993

(22) Filed: Feb. 8, 2018

(65) Prior Publication Data

US 2018/0228049 A1 Aug. 9, 2018

(30) Foreign Application Priority Data

Feb. 9, 2017 (CN) .................. 2017 2 01217965 U

(51) Int. Cl.
*H05K 7/14* (2006.01)
*A47B 88/407* (2017.01)
*A47B 88/477* (2017.01)

(52) U.S. Cl.
CPC ......... *H05K 7/1489* (2013.01); *A47B 88/407* (2017.01); *A47B 88/477* (2017.01)

(58) Field of Classification Search
None
See application file for complete search history.

(56) References Cited

U.S. PATENT DOCUMENTS

| | | | | |
|---|---|---|---|---|
| 6,181,549 B1* | 1/2001 | Mills | ..................... | H05K 7/1489 292/114 |
| 6,257,439 B1* | 7/2001 | Hsu | ........................ | A47J 45/061 16/425 |
| 6,579,029 B1* | 6/2003 | Sevde | ................... | H05K 7/1409 403/321 |
| 9,609,778 B1* | 3/2017 | Spencer | .................. | G06F 1/183 |
| 9,723,745 B2* | 8/2017 | Qi | .......................... | H05K 7/1489 |
| 9,795,052 B2* | 10/2017 | Hsiao | .................... | H05K 7/1489 |
| 2006/0053599 A1* | 3/2006 | Chang | ........................ | F16B 2/10 24/455 |
| 2009/0181568 A1* | 7/2009 | Chiang | ................ | H05K 7/1409 439/310 |
| 2010/0254106 A1* | 10/2010 | Graybill | ............... | H05K 7/1489 361/760 |

(Continued)

OTHER PUBLICATIONS

Taiwan Office Action for Taiwan Application No. 107200779, dated Aug. 7, 2018 with translation, 5 pages.

*Primary Examiner* — Xanthia C Cunningham
(74) *Attorney, Agent, or Firm* — RatnerPrestia

(57) ABSTRACT

A rack attachment device configured for attaching an electronic device to a rack. The rack attachment device includes a housing for coupling to the electronic device, a pawl mounted for movement relative to the housing, a slide mounted for movement relative to the housing, where the slide is positionable to contact the pawl, and a handle extending from the housing and coupled to the slide. In an unlocked position, the handle is in a first handle position and the slide is in a first slide position, such that the slide prevents the pawl from moving toward a rack aperture defined in the rack. In a locked position, the handle is in a second handle position and the slide is in a second slide position, such that the slide permits the pawl to enter the rack aperture when the slide is in the second slide position.

26 Claims, 28 Drawing Sheets

(56) References Cited

U.S. PATENT DOCUMENTS

| | | | |
|---|---|---|---|
| 2011/0273850 A1* | 11/2011 | Chen | H05K 5/0221 |
| | | | 361/726 |
| 2013/0018505 A1* | 1/2013 | Barrett | G06F 19/3462 |
| | | | 700/231 |
| 2013/0241377 A1* | 9/2013 | Zhang | H05K 5/0221 |
| | | | 312/223.2 |
| 2013/0241378 A1* | 9/2013 | Zhang | H05K 5/0221 |
| | | | 312/223.2 |
| 2014/0314347 A1* | 10/2014 | Huang | A47B 88/427 |
| | | | 384/22 |
| 2015/0156912 A1* | 6/2015 | Liang | H05K 5/0221 |
| | | | 361/726 |
| 2015/0250312 A1* | 9/2015 | Barrett | E05B 47/00 |
| | | | 312/319.1 |
| 2015/0296649 A1* | 10/2015 | Wang | H05K 7/1409 |
| | | | 403/326 |
| 2015/0327389 A1* | 11/2015 | Westphall | H01R 12/7005 |
| | | | 361/748 |
| 2016/0150659 A1* | 5/2016 | Chen | H05K 7/1487 |
| | | | 312/223.2 |
| 2016/0157377 A1* | 6/2016 | Nishiyama | H05K 7/1489 |
| | | | 361/679.58 |
| 2016/0219731 A1* | 7/2016 | Lin | H05K 5/0217 |
| 2016/0345453 A1* | 11/2016 | Zhang | H05K 5/0234 |
| 2017/0150634 A1* | 5/2017 | Huang | H05K 7/1489 |
| 2017/0347794 A1* | 12/2017 | McGregor | A47B 88/49 |
| 2018/0255926 A1* | 9/2018 | Chen | A47B 88/407 |

* cited by examiner

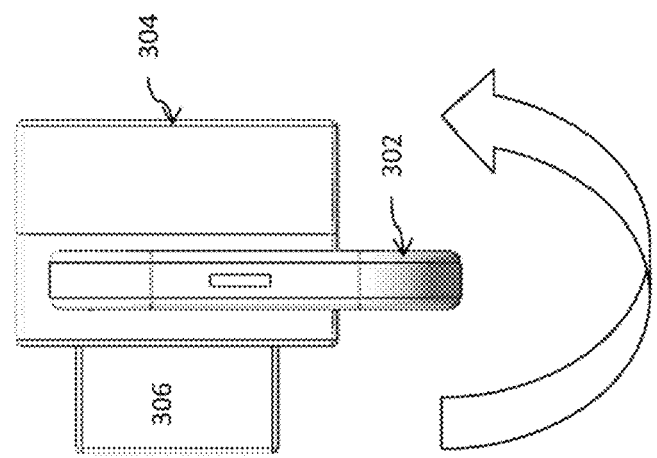

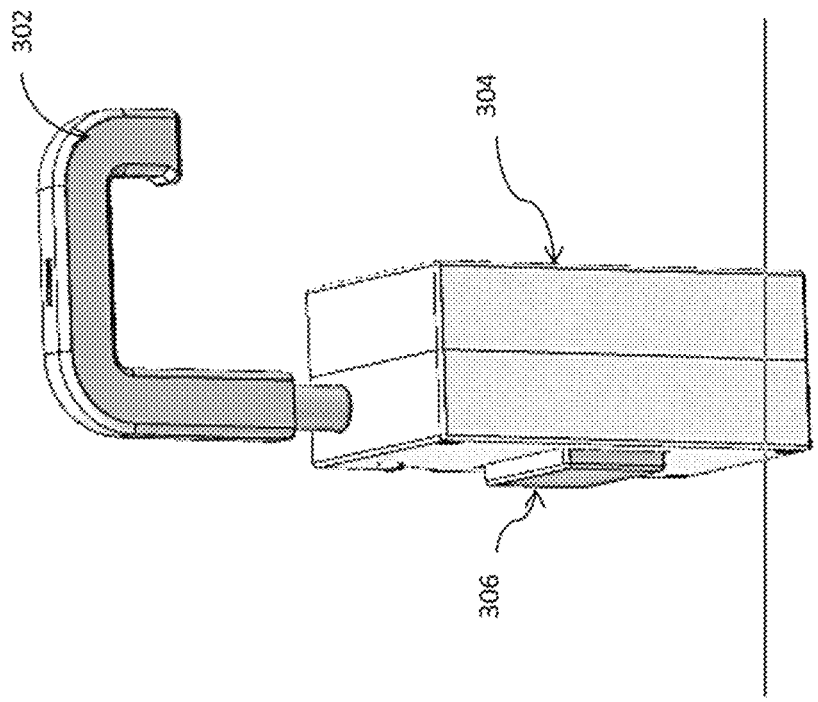

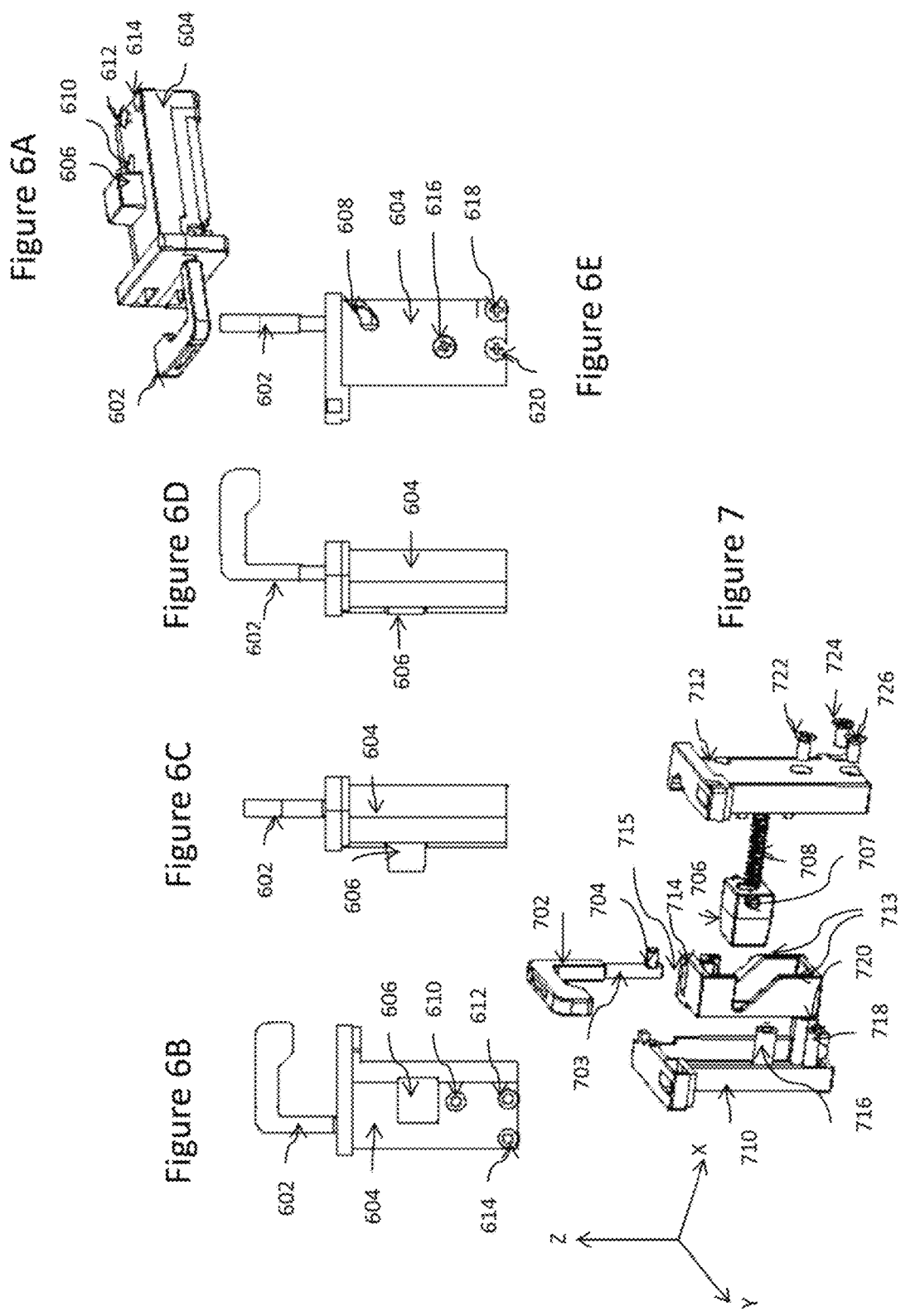

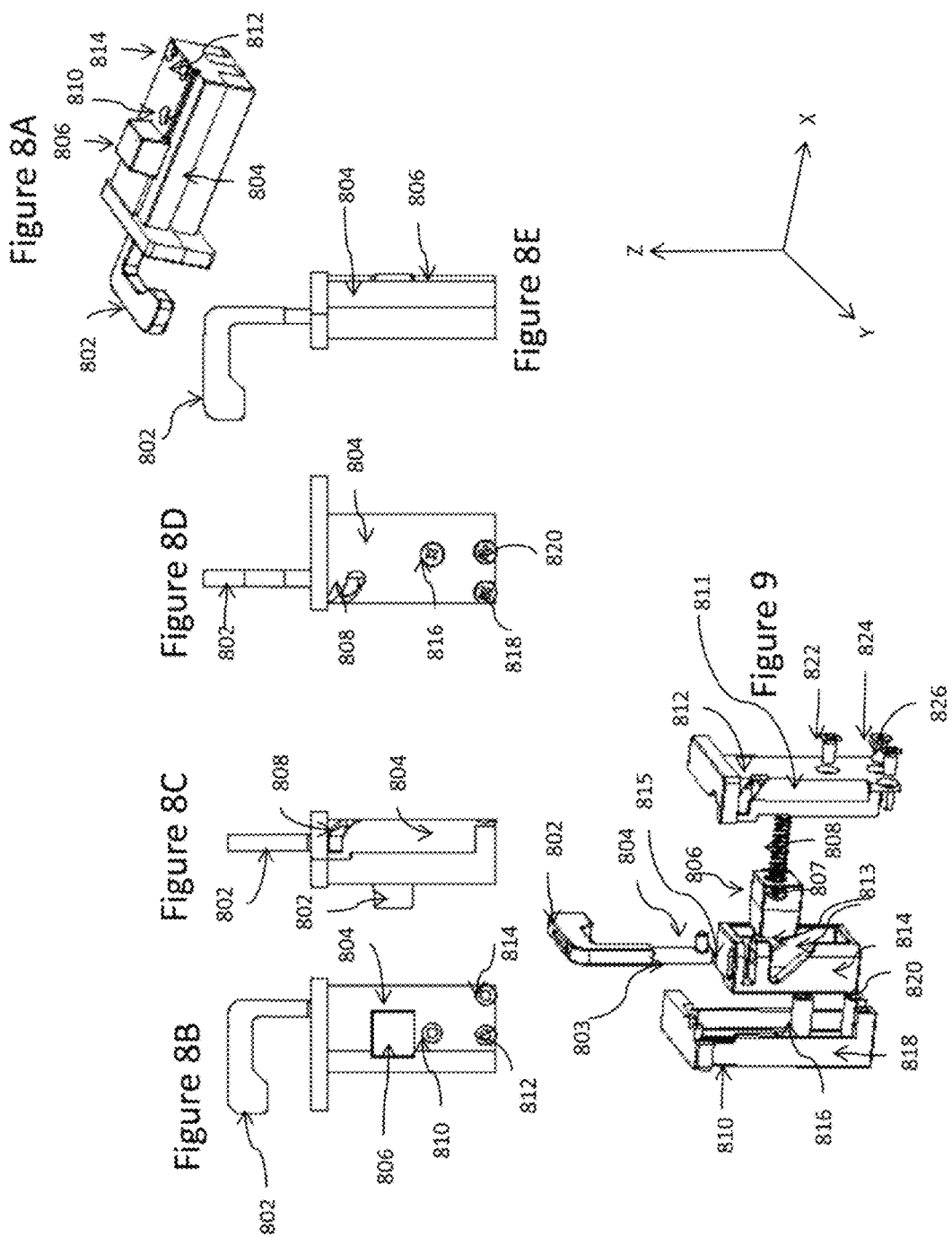

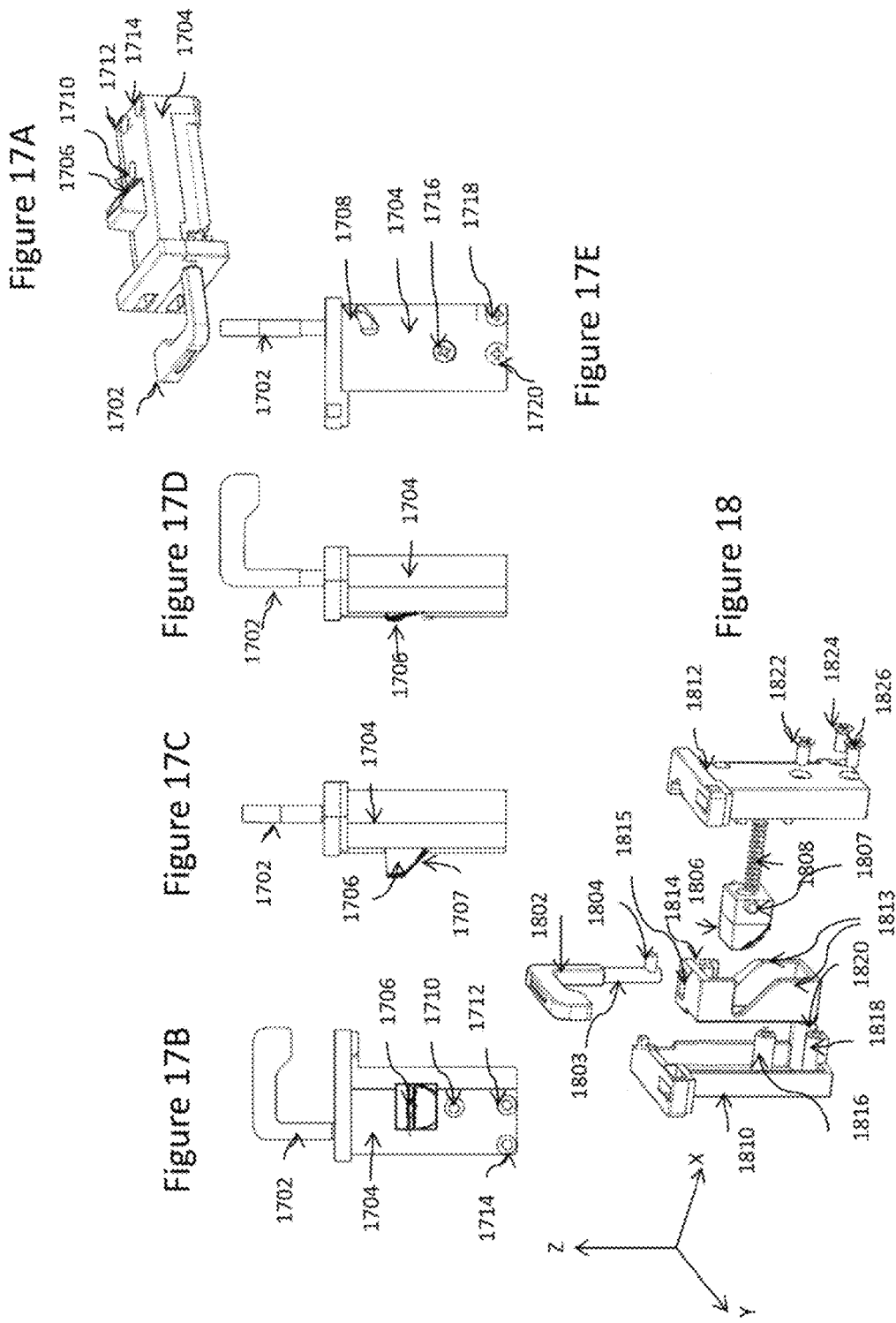

COMPUTER RACK ATTACHMENT

This Application claims priority to and the benefit of Chinese Utility Model Application No. 2017201217965, filed on Feb. 9, 2017, which Is incorporated herein by reference.

FIELD OF THE INVENTION

This invention relates generally to a rack attachment device for securing electronic devices to a computer rack. The rack attachment device is coupled to the electronic device, and allows a user to couple/decouple the electronic device to/from the computer rack.

BACKGROUND OF THE INVENTION

A conventional mounting system/method for securing an electronic device to a computer rack relies primarily on multiple fasteners (e.g. screws). Typically, the user (e.g. technician) inserts the electronic device into a shelf of the computer rack. Screws are then inserted into the both the electronic device and the rack. In order to remove the electronic device from the rack, the screws must be removed. The process of fastening the electronic device to the rack and the process of removing the fastened electronic device from the rack using screws is time consuming and labor intensive for the technician.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 3A shows the left-side rack attachment device in the locked position.

FIG. 3B shows the left-side rack attachment device in the unlocked position.

FIG. 6A shows a perspective view of the left-side rack attachment device.

FIG. 6B shows a left side view of the left-side rack attachment device.

FIG. 6C shows a bottom view of the left-side rack attachment device in the locked position.

FIG. 6D shows a bottom view of the left-side rack attachment device in the unlocked position.

FIG. 6E shows a right side view of the left-side rack attachment device.

FIG. 7 shows an exploded view of the left-side rack attachment device.

FIG. 8A shows a perspective view of the right-side rack attachment device.

FIG. 88 shows a right side view of the right-side rack attachment device.

FIG. 8C shows a top view of the right-side rack attachment device in the locked position.

FIG. 8D shows a left side view of the right-side rack attachment device.

FIG. 8E shows a bottom view of the right-side rack attachment device in the unlocked position.

FIG. 9 shows an exploded view of the right-side rack attachment device.

FIG. 17A shows a perspective view of the left-side push-to-close rack attachment device.

FIG. 17B shows a left side view of the left-side push-to-close rack attachment device.

FIG. 17C shows a bottom view of the left-side push-to-close rack attachment device in the locked position.

FIG. 17D shows a bottom view of the left-side push-to-close rack attachment device in the unlocked position.

FIG. 17E shows a right side view of the left-side push-to-close rack attachment device.

FIG. 18 shows an exploded view of the left-side push-to-close rack attachment device.

SUMMARY OF THE INVENTION

Figure 1A:
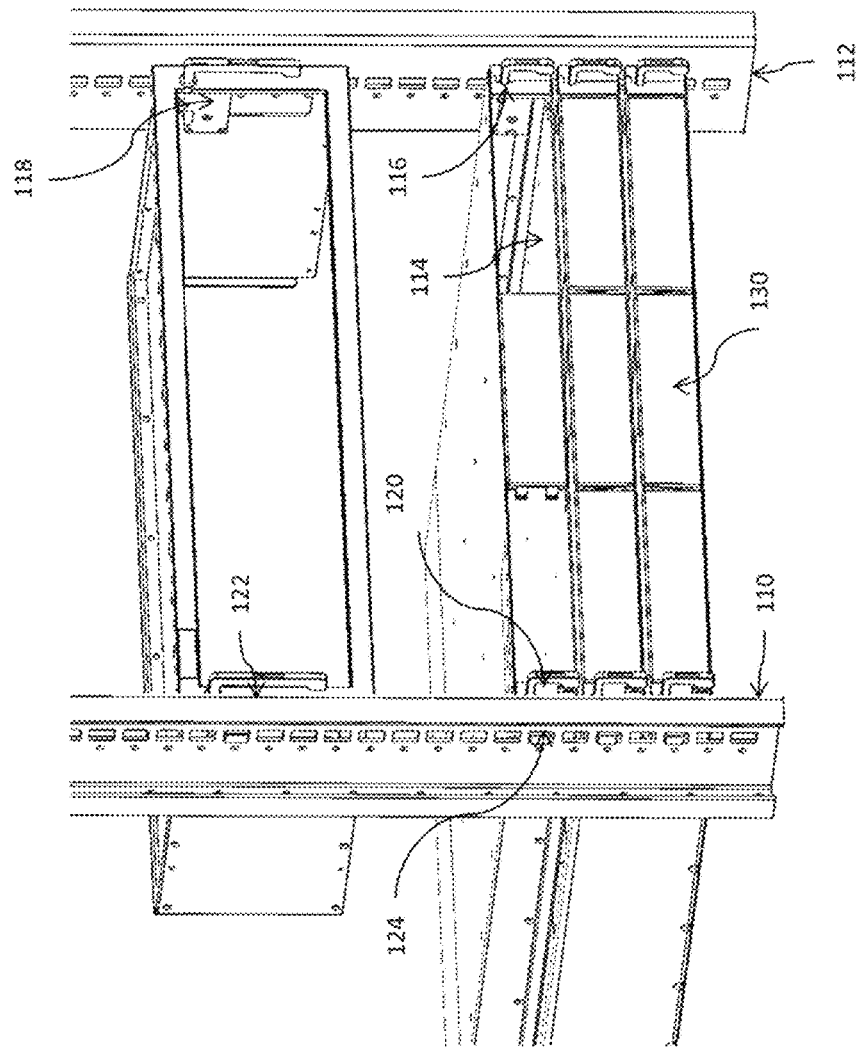
FIG. 1A shows an embodiment of a computer rack system having rack attachment devices in a locked position.

One embodiment includes a rack attachment apparatus configured for attaching an electronic device to a rack. The rack attachment apparatus comprising a housing configured for coupling to the electronic device, a pawl at least partially enclosed by the housing and mounted for movement relative to the housing along a pawl axis, an end portion of the pawl being sized to extend into a rack aperture defined in the rack, a slide at least partially enclosed by the housing and mounted for movement relative to the housing along a slide axis angled relative to the pawl axis, the slide being positionable to contact the pawl, and a handle extending from the housing and coupled to the slide. In an unlocked position, the handle is in a first handle position and the slide is in a first slide position, the slide having a slide surface preventing the pawl from moving along the pawl axis toward the rack aperture defined in the rack when the slide is in the first slide position. In a locked position, the handle is in a second handle position and the slide is in a second slide position, the slide surface permitting the pawl to enter the rack aperture defined in the rack when the slide is in the second slide position.

Another embodiment includes a computer rack system, including a computer rack having at least one shelf for supporting electronic devices, and a rack attachment apparatus connected to at least one of the electronic devices and seated on at least one shelf of the computer rack. The rack attachment apparatus including a housing configured for coupling to the electronic device, a pawl at least partially enclosed by the housing and mounted for movement relative to the housing along a pawl axis, an end portion of the pawl being sized to extend into a rack aperture defined in the rack, a slide at least partially enclosed by the housing and mounted for movement relative to the housing along a slide axis angled relative to the pawl axis, the slide being positionable to contact the pawl, and a handle extending from the housing and coupled to the slide. In an unlocked position, the handle is in a first handle position and the slide is in a first slide position, the slide having a slide surface preventing the pawl from moving along the pawl axis toward the rack aperture defined in the rack when the slide is in the first slide position. In a locked position, the handle is in a second handle position and the slide is in a second slide position, the slide surface permitting the pawl to enter the rack aperture defined in the rack when the slide is in the second slide position.

DETAILED DESCRIPTION OF EMBODIMENTS OF THE INVENTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

A computer rack is a device for supporting various electronic devices. These electronic devices may include, but are not limited to, server computers, database storage devices, telecommunication equipment, etc., that may be interconnected with each other or other network components located in nearby racks or located remote from the rack. Typically, a user (e.g. a technician) has access to the computer rack, and is able to install and remove these electronic devices based on an employer's and/or client's needs.

FIG. 1A shows an example of a computer rack 100 that includes vertical rack rails 110/112 that have multiple apertures, shelves 114 that are connected and supported by rack rails 110/112, and electronic devices 130 which are individually, or as a group inserted (e.g. by a technician) into a respective shelf of the computer rack during an installation process. In order to quickly and easily install and/or remove electronic devices 130, computer rack attachment devices 116, 118, 120 and 122 are mounted internally or to the external side housing of respective electronic devices 130. The details of these rack attachment devices are described later. The rack attachment devices each have a handle connected to an internal locking mechanism (not shown) that prevents or permits a pawl 124 from entering an adjacent aperture in rack rails 110/112.

Figure 1B:
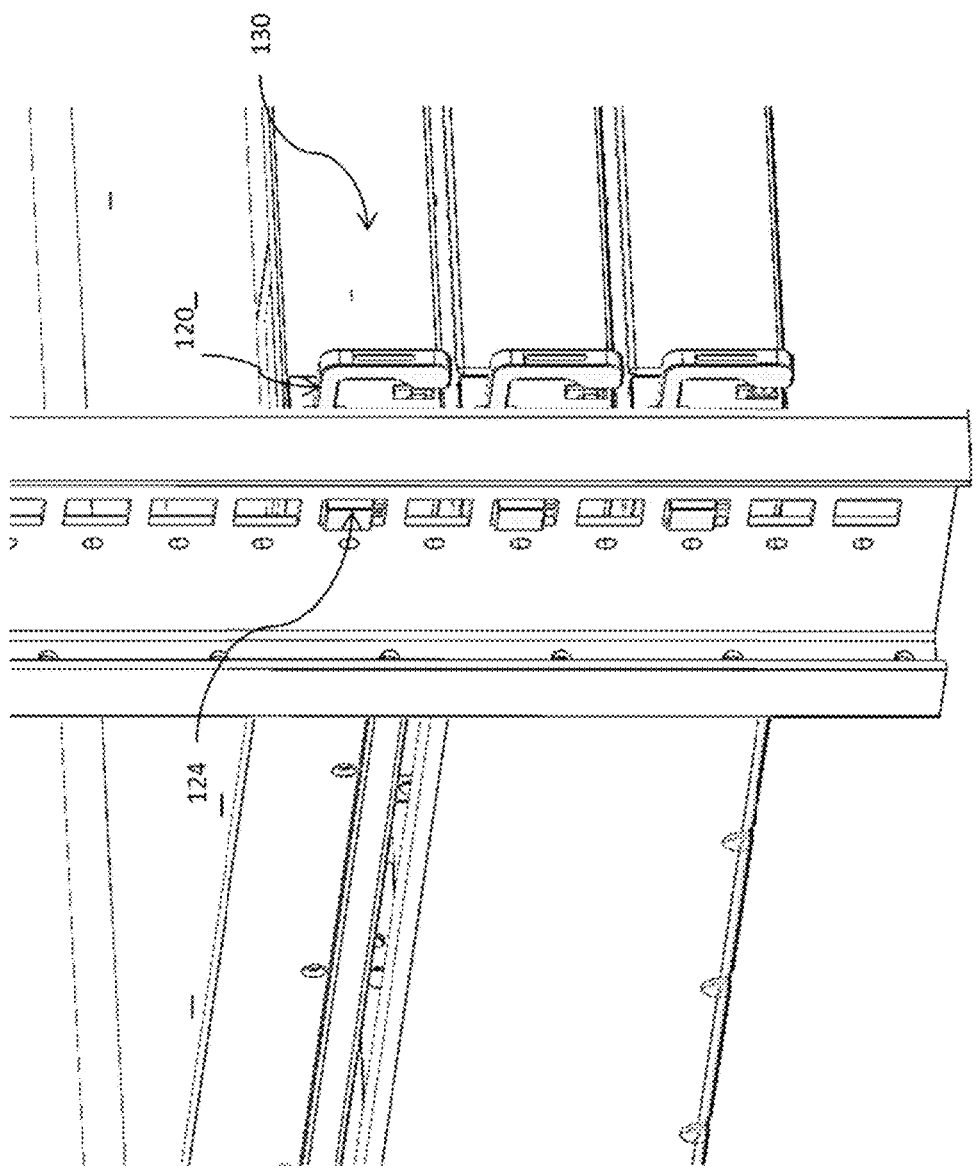
FIG. 1B shows a close up view of the computer rack system in FIG. 1A.

Shown in FIG. 1B is a close up view of the rack attachment device 120 in a "locked position" where the handle is positioned vertically with respect to the rack attachment device. In this locked position, the internal locking mechanism forces the pawl 124 to exit the rack attachment device housing and become engaged with an adjacent rack aperture. This configuration ensures that the electronic devices 130 attached to the rack attachment devices are secured in the rack and are prevented from being removed from the rack. Details of the structure and operation of rack attachment devices are described throughout the specification.

Figure 1C:
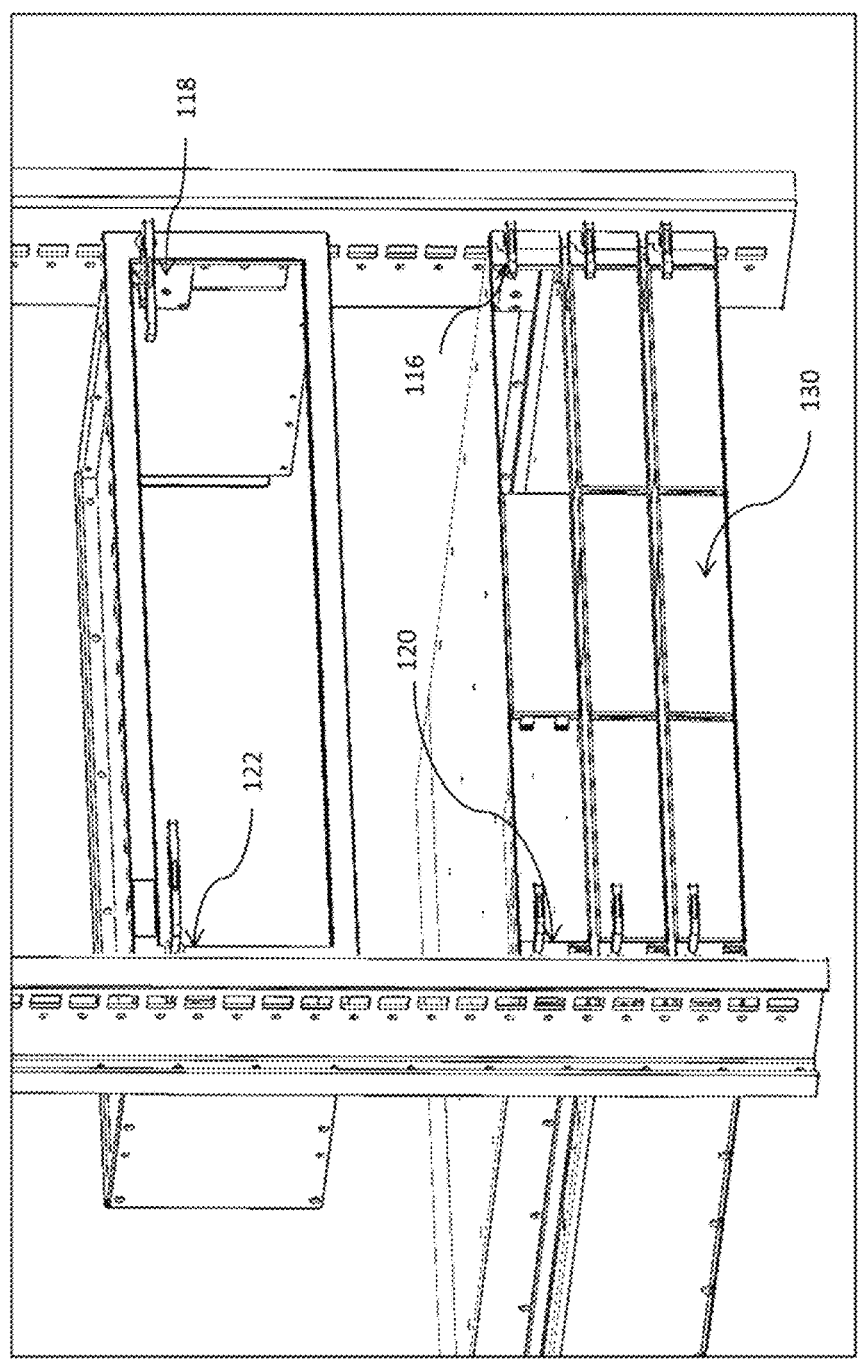
FIG. 1C shows the computer rack system in an unlocked position.
Figure 1D:
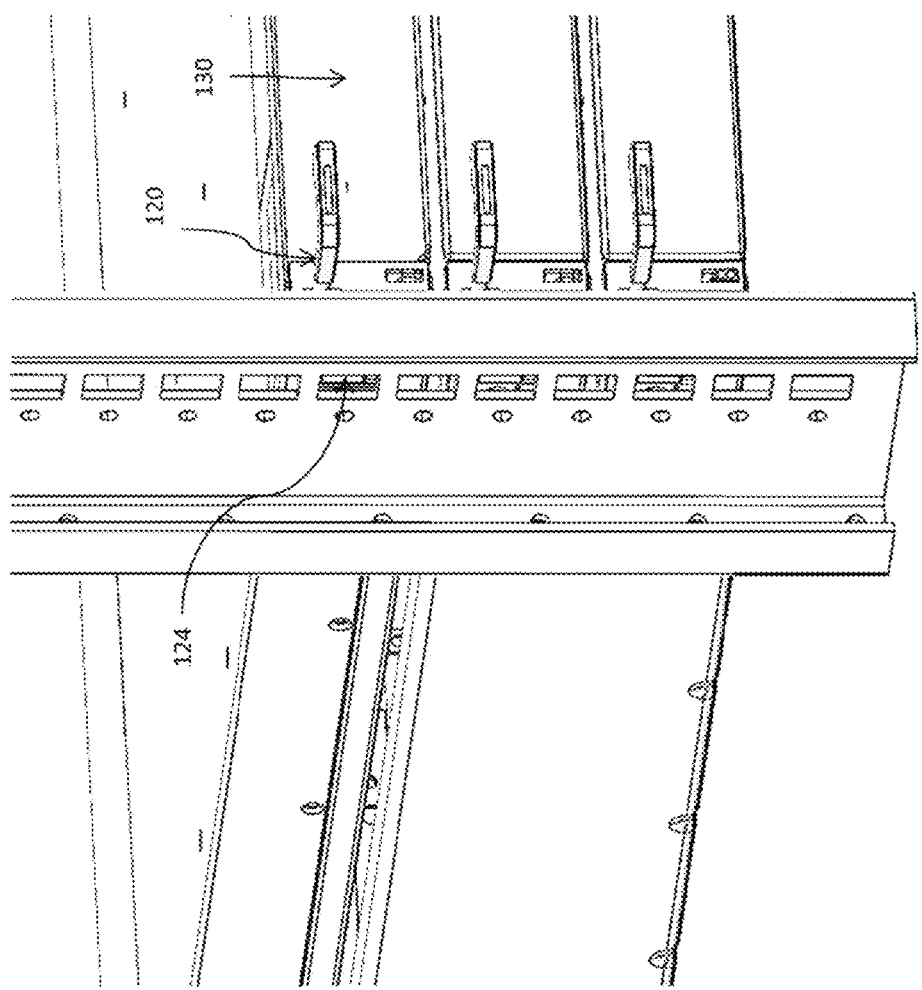
FIG. 1D shows a close up view of the computer rack system in FIG. 1C.

Shown in FIG. 1C is another view of the rack attachment device 120 in an "unlocked position" where the handle is positioned horizontally with respect to the rack attachment device. In this unlocked position, the Internal locking mechanism retracts pawl 124 back into the rack attachment device housing which disengages pawl 124 from the adjacent rack aperture. This configuration allows electronic devices 130 attached to the rack attachment devices to be removed from the rack. A close up view of the rack attachment device 120 in the unlocked position is shown in FIG. 1D where pawl 124 is no longer engaged with the rack rail aperture.

Figure 1E:
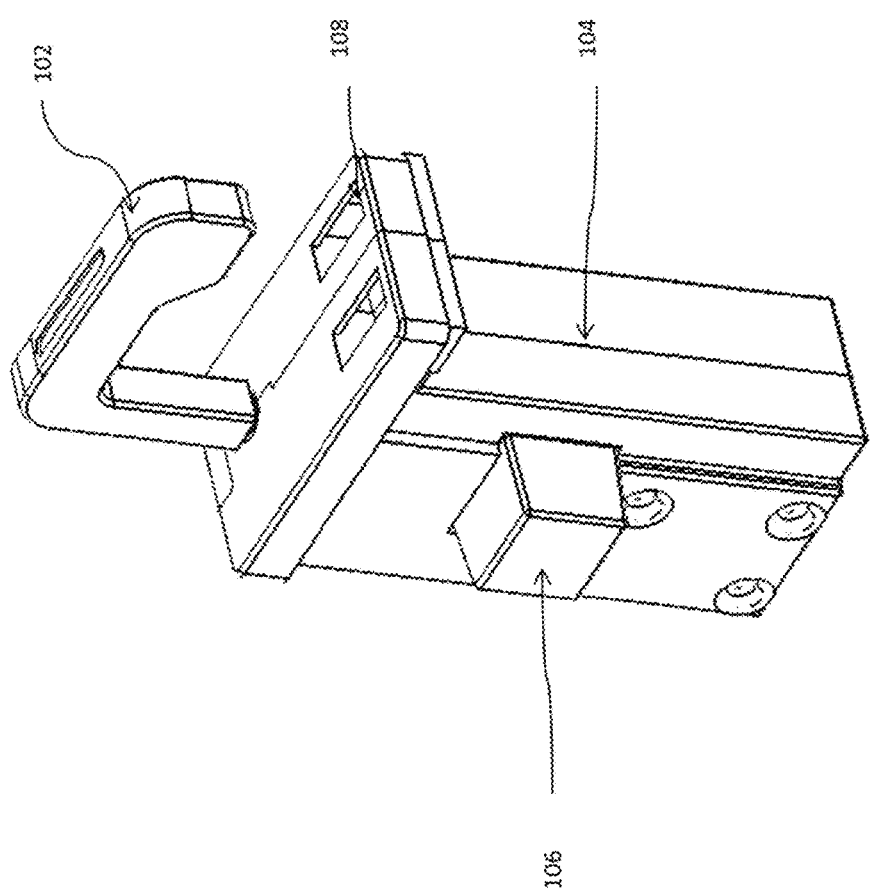
FIG. 1E shows an embodiment of a left-side rack attachment device.

FIG. 1E shows an example drawing of a rack attachment device that includes handle 102, housing 104, pawl 106 and optional bracket 108. Generally, the rack attachment device is mounted either internally to the housing of the electronic device, or is mounted to the external side of electronic device housing (not shown). Mounting may be performed by fastening (e.g. screwing, gluing, welding, snapping, etc.) the rack attachment device to the housing of the respective electronic device.

Bracket 108 in FIG. 1E is optional, and may include openings for ports of telecommunication cabling (e.g. Ethernet cable) for connecting the electronic device 110 to other electronic devices in the rack. In addition, although handle 102 is shown as having a curved shape, handle 102 is not limited to this type of shape or configuration. Any general handle shape that allows handle 102 to be grasped by a human hand would be appropriate.

Figure 2A:
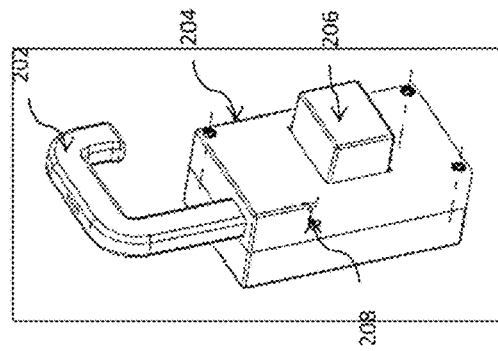
FIG. 2A shows a left side view of the left-side rack attachment device.
Figure 2B:
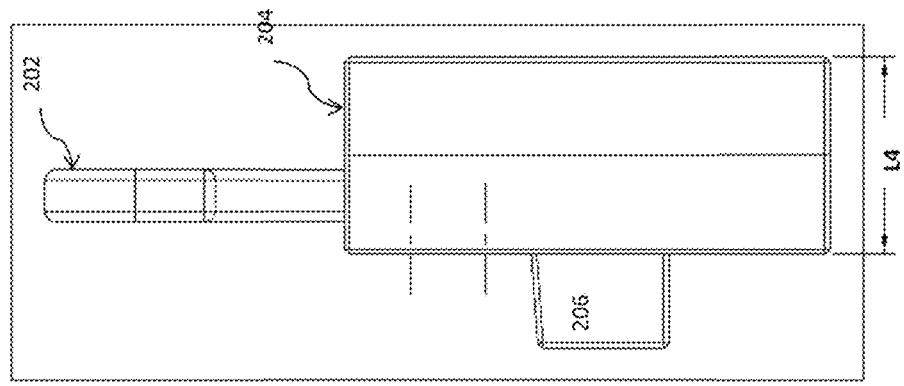
FIG. 2B shows a bottom view of the left-side rack attachment device.
Figure 2C:
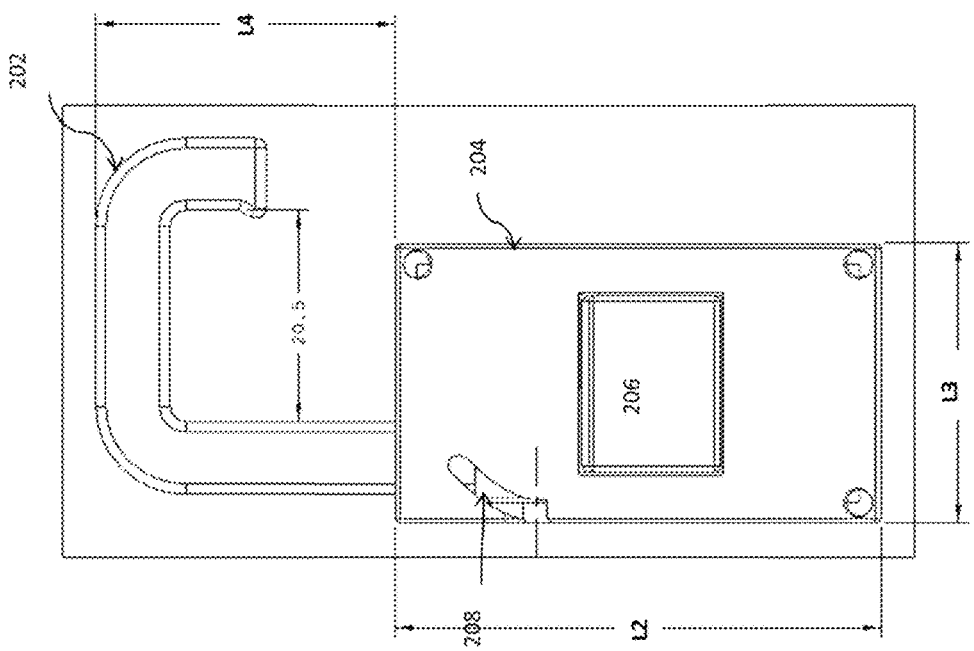
FIG. 2C shows a perspective view of the left-side rack attachment device.

FIGS. 2A, 2B and 2C show additional views of the rack attachment device. For example, FIG. 2A is a side view that shows handle 202, housing 204, and pawl 206 of the rack attachment device. In addition, FIG. 2A also shows a housing ramp 208 that is a cutout portion of the housing that interacts with a shaft (not shown) of handle 202 to operate an internal locking mechanism (not shown) in the rack attachment device. The details of housing ramp 208 are described later.

FIG. 2B shows a bottom view of rack attachment device, and FIG. 2C shows a perspective view of rack attachment device. The rack attachment device may have dimensions L1, L2, 13 and L4. These dimensions may be determined based on the dimensions of the rack and the dimensions of the electronic devices. The general structure of the rack attachment device is shown in FIGS. 2A-2C. The operation of the rack attachment device will now be generally described with respect to FIGS. 3A and 3B.

As shown in FIG. 3A, handle 302 is shown in a first (e.g. vertical) position. In this first position, the locking mechanism (not shown) inside housing 304 permits pawl 306 to at least partially exit the housing and enter an aperture on rack rail 110 similar to that shown in FIG. 1A. This first position is called a "locked position," because the rack attachment device, and the connected electronic device are locked into a shelf of the computer rack (e.g. the pawl prevents the device from moving).

Handle 302, however, may be rotated in the direction shown by the arrow in FIG. 3A. As a result of this rotation, shown in FIG. 3B, handle 302 is placed in a second (e.g. horizontal) position. In this second position (e.g. 90° from the first position), the locking mechanism inside housing 304 prevents pawl 306 from exiting the housing and entering the rack rail aperture. This second position is called an "un-locked position," because the rack attachment device, and the connected electronic device are able to be installed or removed from the computer rack (e.g. the pawl is not preventing the device from moving).

Figure 4A:
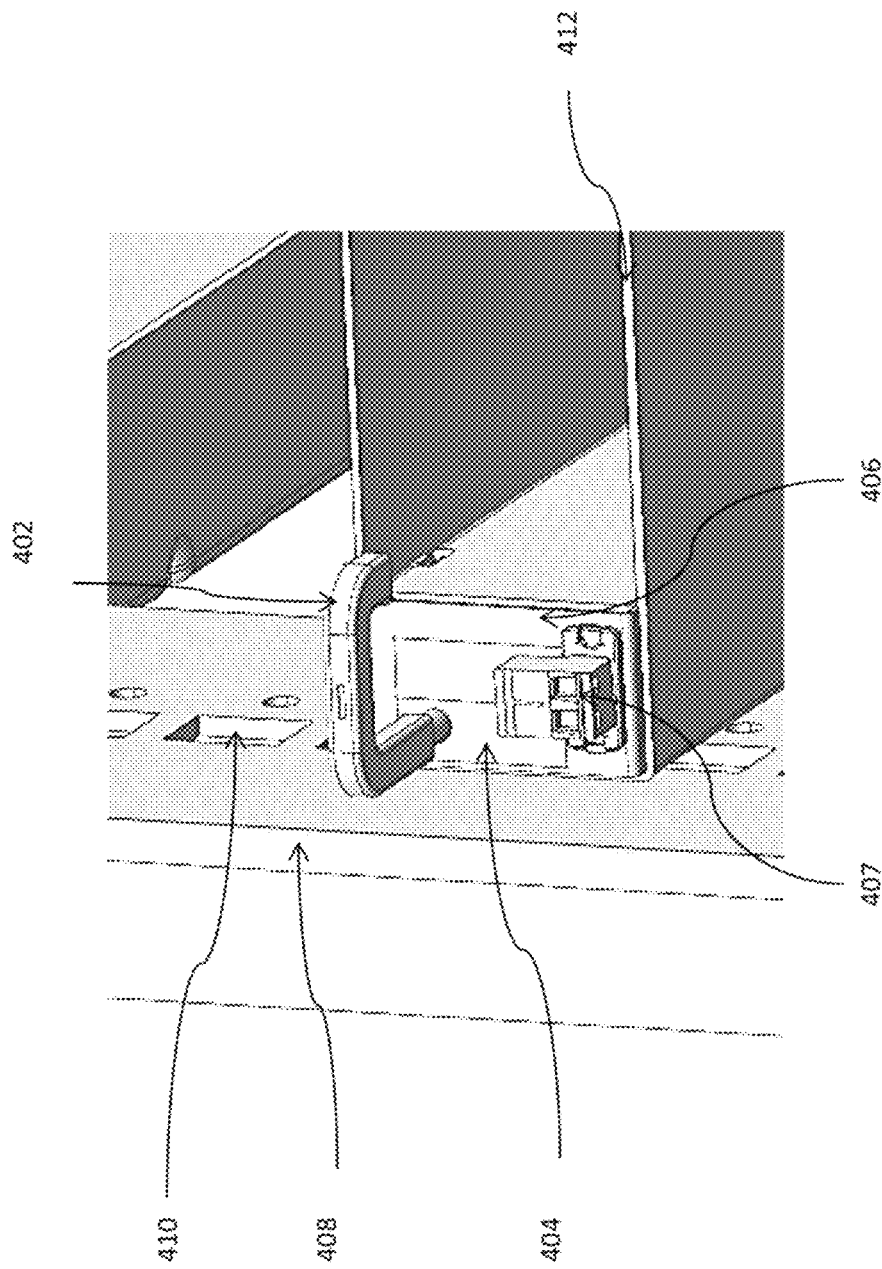
FIG. 4A shows a view of the left-side rack attachment device in the unlocked position in the computer rack system.
Figure 4B:
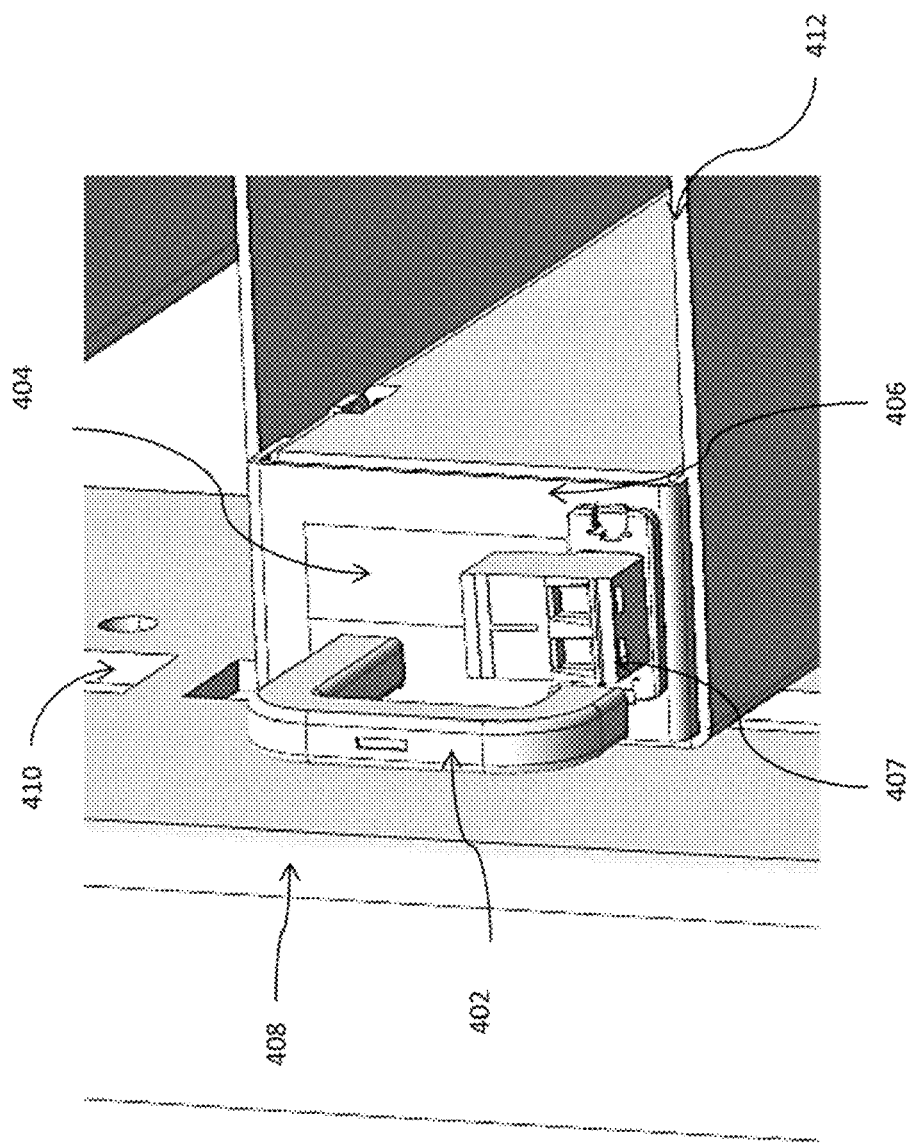
FIG. 4B shows a view of the left-side rack attachment device in the locked position in the computer rack system.

For further clarity, FIGS. 4A and 4B show views of the rack attachment device installed in the computer rack while in both the unlocked and locked position respectively. For example, FIG. 4A shows rack attachment device 404 coupled to an electronic device 406 and installed on shelf 412 of the computer rack. When handle 402 is in the horizontal position, as shown in FIG. 4A, rack attachment device 404 is in the un-locked position. Specifically the pawl (not shown) is prevented from entering an adjacent aperture (not shown but similar to aperture 410) of rack rail 408. In this state, the rack attachment device 404 and connected electronic device 406 may be easily removed from the rack and/or inserted into the rack.

In the example shown in FIG. 4B, however, handle 402 has been rotated in a clockwise direction, and is now in a vertical position, which places rack attachment device 404 into the locked position. Specifically, the pawl (not shown) is permitted to enter an adjacent aperture (not shown but similar to aperture 410) of rack rail 408. In this state, the rack attachment device 404 and connected electronic device 406 are secured in the rack.

It should be noted that FIGS. 4A and 4B show rack attachment device 404 mounted internal to the electronic device 406. Other configurations, however, are possible. For example, rack attachment device 404 may be mounted (e.g. screwed, glued, welded, snapped, etc.) to the external housing of electronic device 406. In addition, the communication ports shown on the front of electronic devices 406 in FIGS. 4A and 4B are optional.

It should also be noted that the handle positions may also be changed. For example, the vertical handle position may be associated with an unlocked position, and the horizontal handle position may be associated with a locked position. In addition, the locked and unlocked handle positions may be at other angles relative to the rack attachment device and relative to each other.

Figure 5:
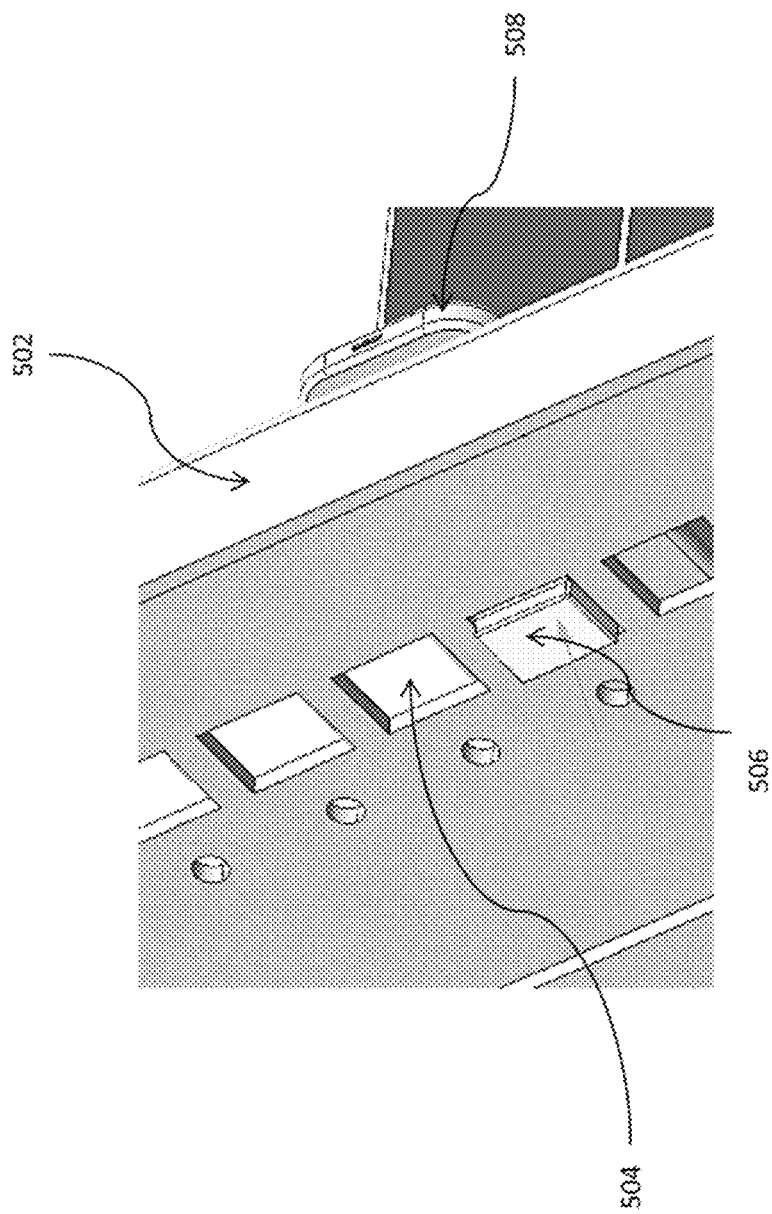
FIG. 5 shows another view of the left-side rack attachment device in the locked position in the computer rack system.

As described in FIGS. 4A and 4B, when the rack attachment device 404 is in the locked position, the pawl is released from rack attachment device 404 and permitted to engage with an adjacent aperture of the rack rail. This Is shown in more detail in the close up view of FIG. 5. For example, as shown in FIG. 5, handle 508 of rack attachment device 404 is in the locked position. Pawl 506 is therefore permitted to move toward and enter an adjacent aperture of the rack rail similar to aperture 504. When pawl 506 is engaged with an aperture of the rack rail 502, the rack attachment device 404 and the connected electronic device are physically secured within the computer rack.

Depending on the relative locations of the electronic device with respect to the rack rail, the rack attachment device may be configured as a "left-side" device or a "right-side" device. For example, if the electronic device is to be mounted on the left side of the computer rack, a left-side rack attachment device would be used (e.g. 120 in FIG. 1A). In contrast if the electronic device is to be mounted on the right side of the computer rack, a right-side rack attachment device would be used (e.g. 116 in FIG. 1A).

A detailed example of a left-side rack attachment device (similar to 120 in FIG. 1A) is shown in FIG. 6A to include handle 602, housing 604, pawl 606, and screw holes 610, 612 and 614. The rack attachment device shown in FIG. 6A is considered a left-side rack attachment device, because pawl 606 protrudes from the left side of the housing relative to the handle when installed. This allows the rack attachment device to be mounted to the left side of an electronic device (similar to 120 in FIG. 1A), such that pawl 606 can engage an adjacent aperture on the left side rack rail 110 of the computer rack.

Additional views of this left-side rack attachment device are shown in FIG. 6B (left side view), FIG. 6C (bottom view in locked position), FIG. 6D (bottom view in unlocked position) and FIG. 6E (right side view). It should be noted that the right side view shown in FIG. 6E also shows housing ramp 608 and screws 616, 618 and 620. These components are described in detail later.

For further clarity, FIG. 7 shows an exploded view of the left-side rack attachment device. Coordinates have been provided to aid in explanation. Generally, the rack attachment device includes a housing split into multiple portions such as two halves 710 and 712. The housing halves are fastened together by screws 722, 724 and 726 which are inserted into holes on 712 and extend through the housing in the X axis to mate with female threaded posts 716, 718 and 720 which may also act as a guide for the slide as it moves back and forth within the housing. These screws may also extend through housing 710 to be attached to the external housing of an electronic device having female threaded holes. The internal mechanism of the rack attachment device includes slide 714, pawl 706 and spring 708.

In general, a substantially flat bottom surface of slide 714 is seated on a substantially flat inner surface of housing 710. Pawl 708 in this example is cube shaped and includes a protruding surface (e.g. pins 707) that ride along ramps 713 of the slide. Spring 708 is a metal spring or the like that resists compression. When the two housing halves are secured together with the screws, spring 708 is compressed between a top surface of pawl 706 and an Inner surface of housing 712.

Handle 702 includes a shaft 703 that extends in a handle axis Z. Shaft 703 includes a surface (e.g. pin 704) that protrudes from the shaft in a pin axis X which Is at an angle to handle axis Z. In order to operate the rack attachment device, shaft 703 including pin 704 are housed in cavity 715 formed in slide 714. When the rack attachment device is assembled, pin 704 abuts at least two surfaces cavity 715 of slide 714, and also abuts a ramp cutout from housing 712 (e.g. housing ramp 608). This allows the handle to be moved in and out of the rack attachment device in the Z axis, thereby moving the slide back and forth in the Z axis.

Generally, when the slide moves back and forth in the Z axis, pins 707 on pawl 706 ride along the surfaces of slide ramps 713. When the pins 707 are in contact with bottom portion of the ramps 713 closer to housing portion 710, the pawl protrudes from the housing and the rack attachment device is in the locked position. When the pins 707, however, are in contact with top portion of the ramps 713 closer to housing portion 712, the pawl is retracted into the housing and the rack attachment device is in the unlocked position. The operation of the rack attachment device is described in more detail later.

In contrast to the rack attachment device shown in FIG. 7, an example of a right-side rack attachment device is shown in FIG. 8A to include handle 802, housing 804, pawl 806, and screw holes 810, 812 and 814. The rack attachment device shown in FIG. 8A is considered a right-side rack attachment device, because pawl 806 protrudes from the right side of the housing relative to the handle when installed. This allows the rack attachment device to be mounted to the right side of an electronic device, such that pawl 806 can engage an aperture on the right side rail 112 of the computer rack.

Additional views of this right-side rack attachment device are shown in FIG. 8B (right side view), FIG. 8C (top view in locked position), FIG. 80 (left side view) and FIG. 8E (bottom view in unlocked position). It should be noted that the left side view in FIG. 8D also shows housing ramp 808 and screws 816, 818 and 820. These components are described in detail later.

For further clarity, FIG. 9 shows an exploded view of the right-side rack attachment device. Coordinates have been provided to aid in explanation. Similar to FIG. 7, the rack attachment device Includes a housing split into two halves 810 and 812. The housing halves are fastened together by screws 822, 824 and 826 which are inserted into holes on 812 and extend through the housing in the X axis and mate with female threaded posts 816, 818 and 820 which may also act as a guide for the slide as it moves back and forth within the housing. These screws may also extend through housing 810 to be attached to the external housing of an electronic device having female threaded holes. The internal mechanism of the rack attachment device includes slide 814, pawl 806 and spring 808.

In general, a substantially flat bottom surface of slide 814 is seated on a substantially flat inner surface of housing 810. Pawl 806 in this example is cube shaped and includes a protruding surface (e.g. pins 807) that ride along ramps 813 of the slide. Spring 808 is a metal spring or the like that resists compression. When the two housing halves are secured (e.g. screwed) together, spring 808 is compressed between a top surface of pawl 806 and an inner surface of housing 812.

Handle 802 includes a shaft 803 that extends in a handle axis Z. Shaft 803 includes a surface (e.g. pin 804) that protrudes from the shaft in a pin axis X which is at an angle to handle axis Z. In order to operate the rack attachment device, shaft 803 including pin 804 are housed in cavity 815 formed in slide 814. When the rack attachment device is assembled, pin 804 abuts at least two surfaces of the slide in cavity 814, and also abuts a ramp cutout from housing 812 (e.g. housing ramp 808). This allows the handle to be moved in and out of the rack attachment device in the Z axis, thereby moving the slide back and forth in the Z axis.

Generally, when the slide moves back and forth in the Z axis, pins 807 on pawl 806 ride along the surfaces of slide ramps 813. When the pins 807 are in contact with bottom portion of the ramps 813 closer to housing portion 810, the pawl protrudes from the housing and the rack attachment device is in the locked position. When the pins 807, however, are in contact with top portion of the ramps 813 closer to housing portion 812, the pawl is retracted into the housing and the rack attachment device is in the unlocked position. The operation of the rack attachment device is described in more detail later.

A difference between the left-side rack attachment device shown in FIG. 7 and the right-side rack attachment device shown in FIG. 9 is the positioning/orientation of the slide. In FIG. 7, for example, the flat bottom surface of the slide contacts housing 710 which is the left portion of the housing relative to the handle when installed. This allows pawl 706 to exit the left side of the housing. In contrast, in FIG. 9, the flat bottom surface of the slide contacts housing 810 which is the right portion of the housing relative to the handle when installed. This allows pawl 806 to exit the right side of the housing.

Generally, a technician has a choice between utilizing the left-side rack attachment device or the right-side rack attachment device first or utilizing them simultaneously. Also, a particular system may include only right-side and/or left-side rack attachment devices, or any combination of right-and/or left-side rack attachment devices. This choice may depend on at least one of the configuration of the rack, configuration of the electronic device, or available space in the rack. For example, if the rack only has available spaces on the right side of the rack, then the technician would attach a right-side rack attachment device to the electronic device for installation.

FIG. 7 shows the detailed structure of a left-side rack attachment device. The detailed operation of such a left-side rack attachment device is now described in reference to FIGS. 10A-11C. It should be noted that operation of a right-side rack attachment device has been omitted, because the operation would substantially similar. Thus, the operation described below would be similar for both the left-side rack attachment device in FIG. 7 and the right-side rack attachment device in FIG. 9.

Figure 10A:
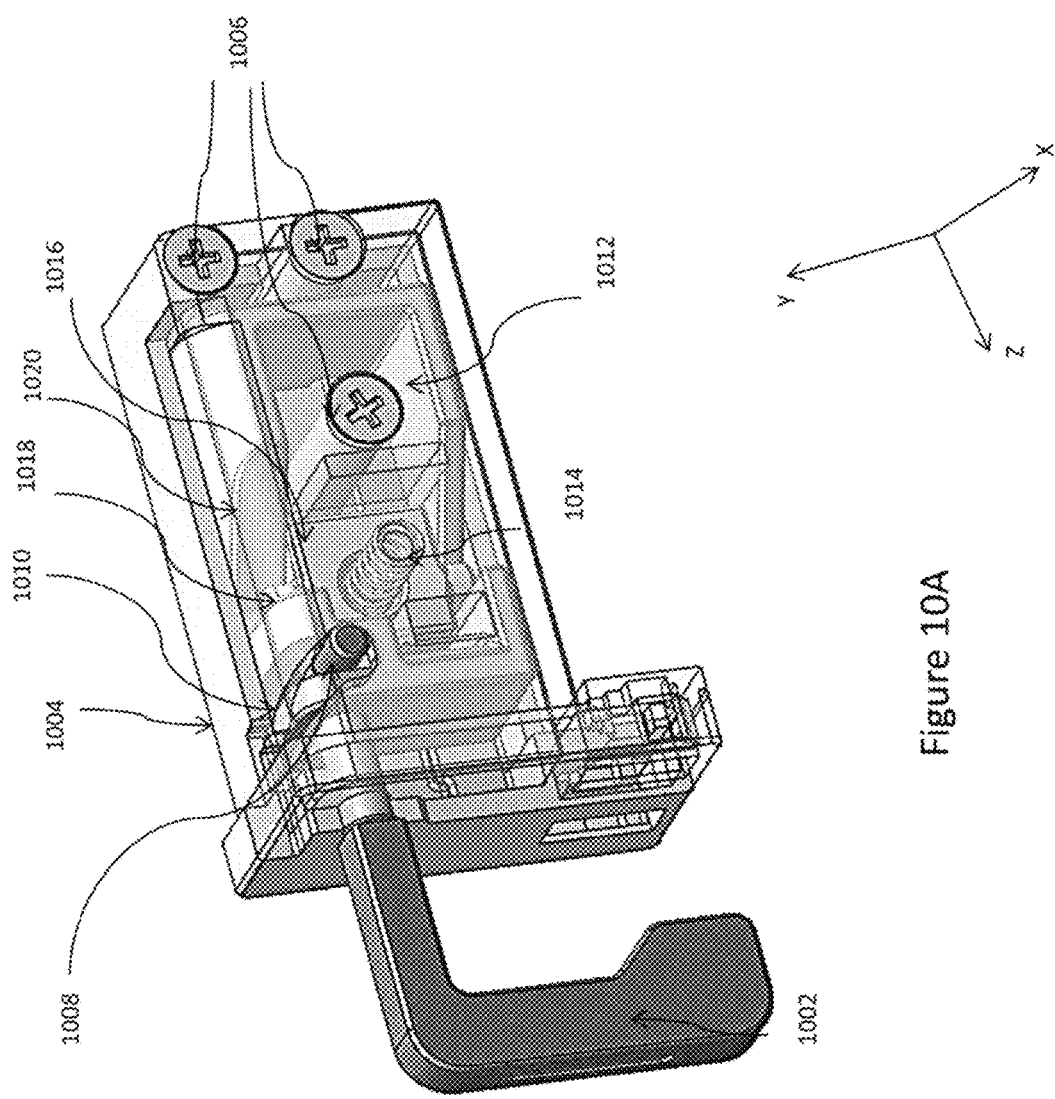
FIG. 10A shows a perspective view of a left-side rack attachment device in the locked position with a transparent surface portion to reveal internal details.

Shown in FIGS. 10A (right side perspective view), 10B (right side view) and 10C (top view) is an example of a left-side rack attachment device in a "locked position." The rack attachment device includes handle 1002, housing 1004, screws 1006 which connect the two housing halves and may also connect the rack attachment device to an electronic device, shaft pin 1008, housing ramp 1010, slide 1012, spring 1014, pawl 1016, pawl pins 1018 and slide ramps 1020. A portion of housing 1004 is shown as being transparent for explanation purposes.

Figure 10B:
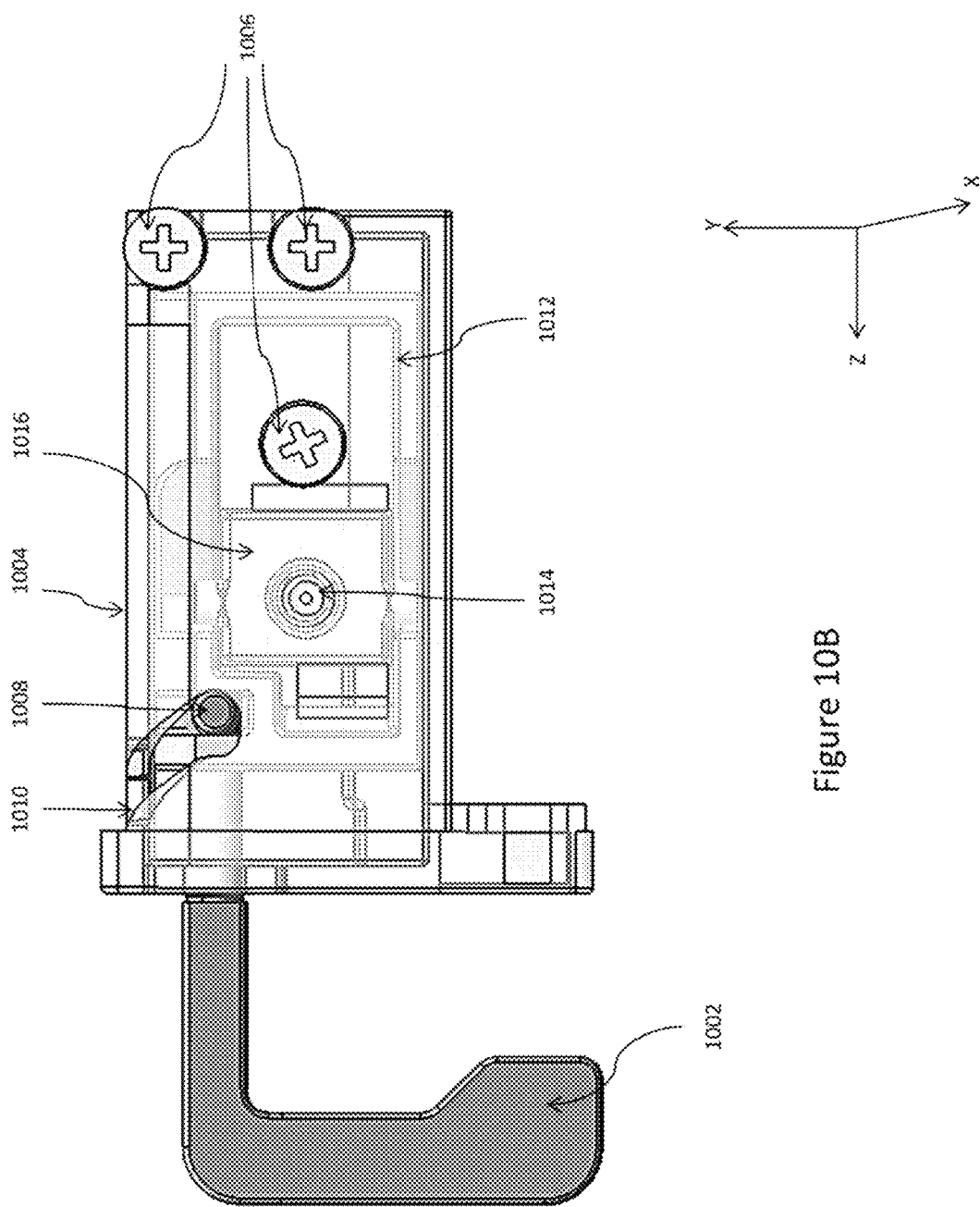
FIG. 10B shows a right side view of a left-side rack attachment device in the locked position with a transparent surface portion to reveal Internal details.
Figure 10C:
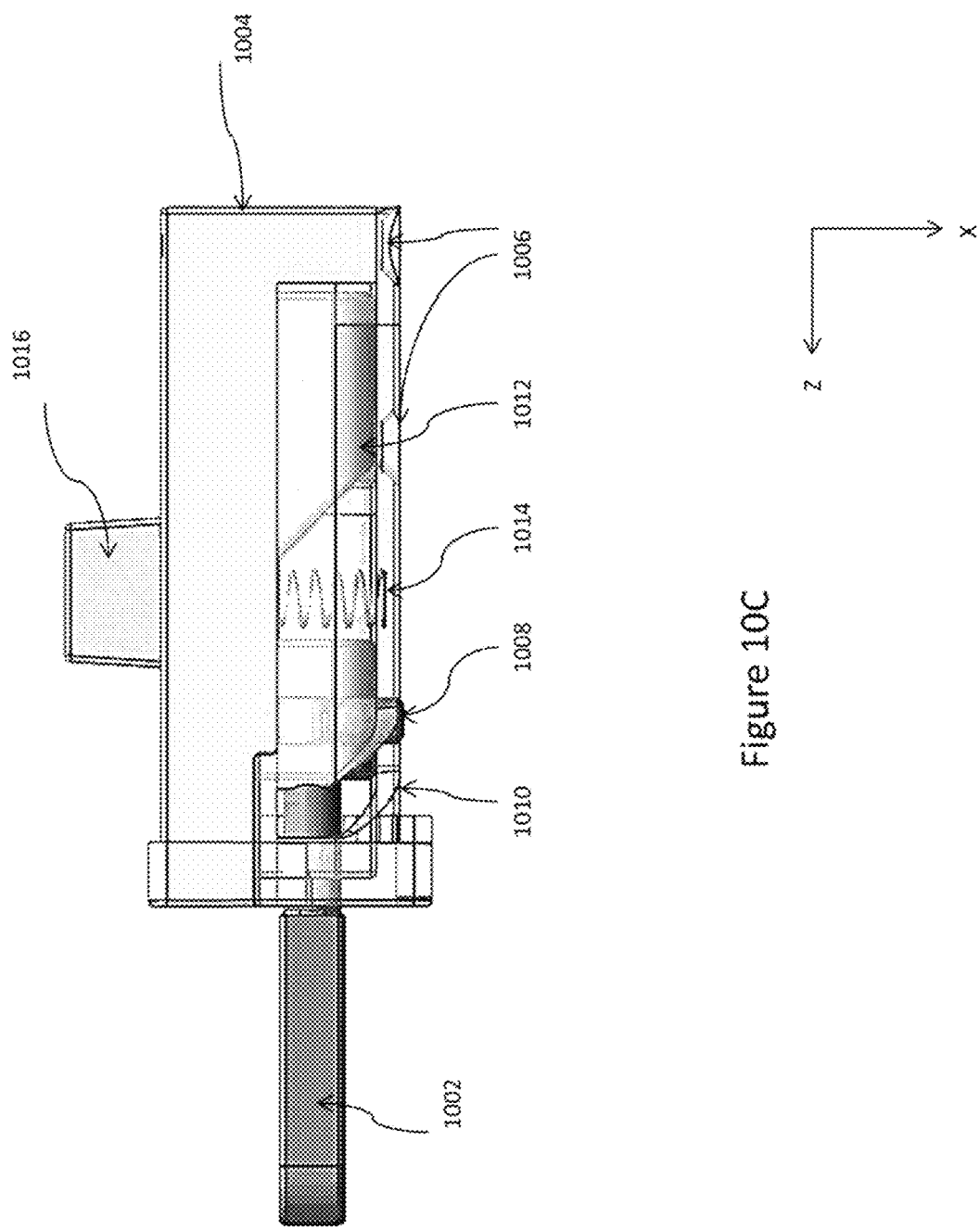
FIG. 10C shows a top view of a left-side rack attachment device in the locked position with a transparent surface portion to reveal internal details.

In FIGS. 10A, 10B and 10C, it is shown that handle 1002 is in a vertical position with respect to the Y axis. In this position, pin 1008 is seated on a first portion of housing ramp 1010. As previously described, slide 1012 is coupled to the shaft of the handle via pin 1008. This allows the handle to push and pull the slide back and forth in the Z axis. In the locked position, the shaft has essentially pushed the slide to the back portion of the housing which allows spring 1014 to push the pawl in the X axis towards the left side of the housing. This spring force positions the pins of pawl 1016 to be seated on a first portion of the slide at a bottom portion (closer to the left side of the housing) of slide ramp surface 1020. This allows pawl 1016 to extend in the X axis and protrude from the left side of the housing to engage an adjacent aperture in the rack rail (not shown).

Figure 11A:
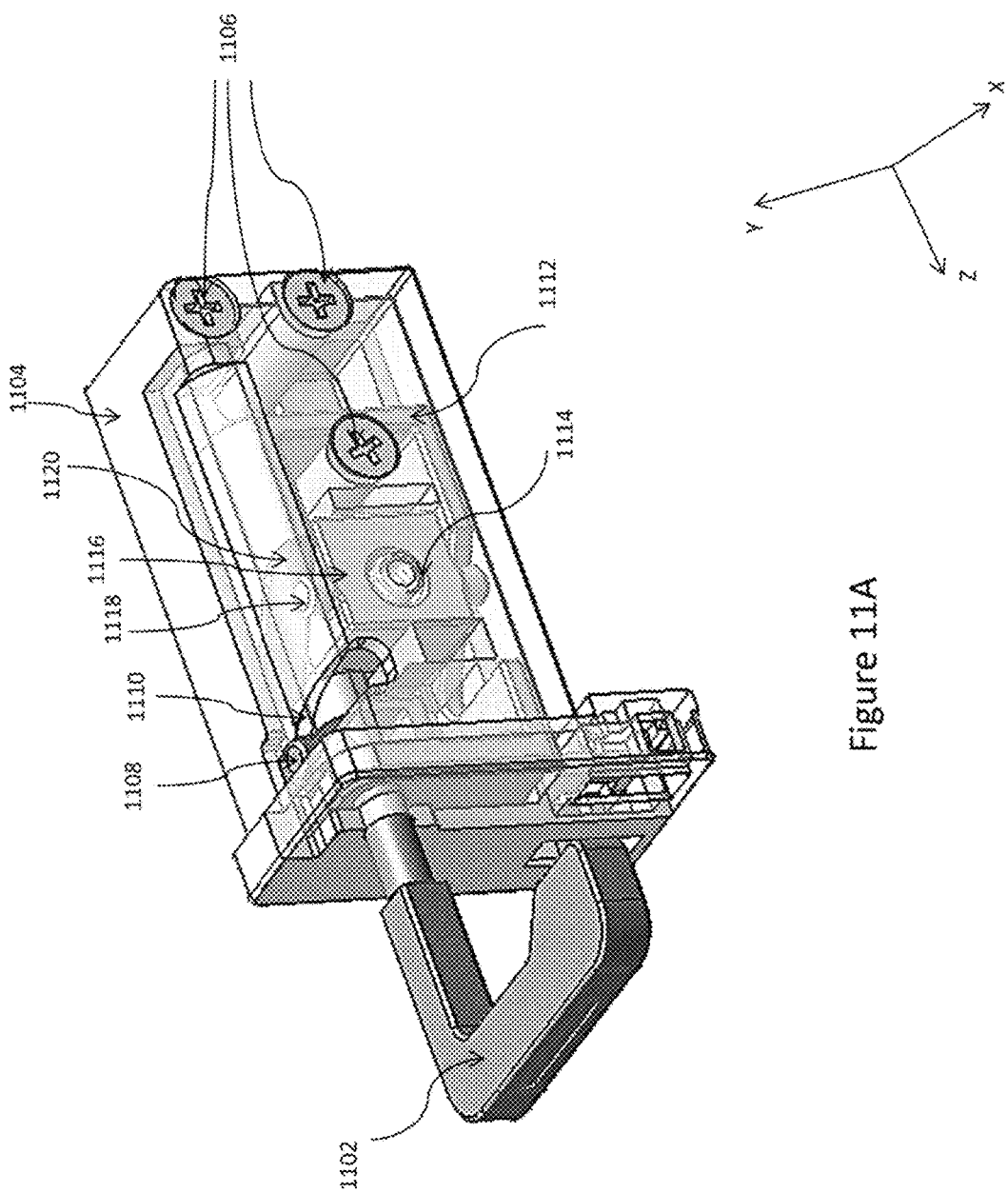
FIG. 11A shows a perspective view of a left-side rack attachment device in the unlocked position with a transparent surface portion to reveal internal details.

Shown in FIGS. 11A (right side perspective view), 11B (right side view) and 11C (top view) is an example of a left-side rack attachment device in an "open position." The rack attachment device includes handle 1102, housing 1104, screws 1106 which connect the two housing halves and may also connect the rack attachment device to an electronic device, shaft pin 1108, housing ramp 1110, slide 1112, spring 1114, pawl 1116, pawl pins 1118 and slide ramp 1120. A portion of housing 1104 is shown as being transparent for explanation purposes.

Figure 11B:
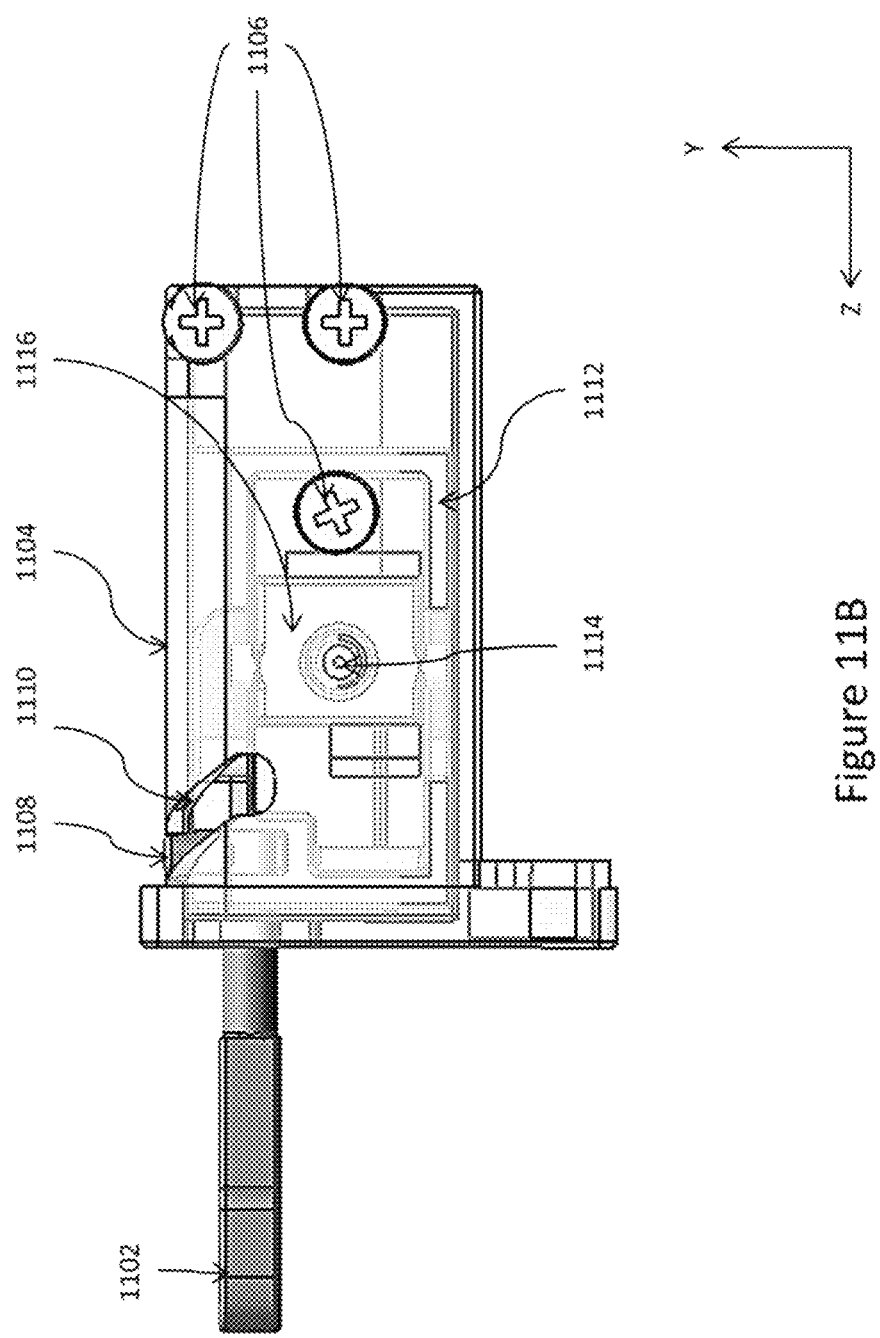
FIG. 11B shows a right side view of a left-side rack attachment device in the unlocked position with a transparent surface portion to reveal internal details.
Figure 11C:
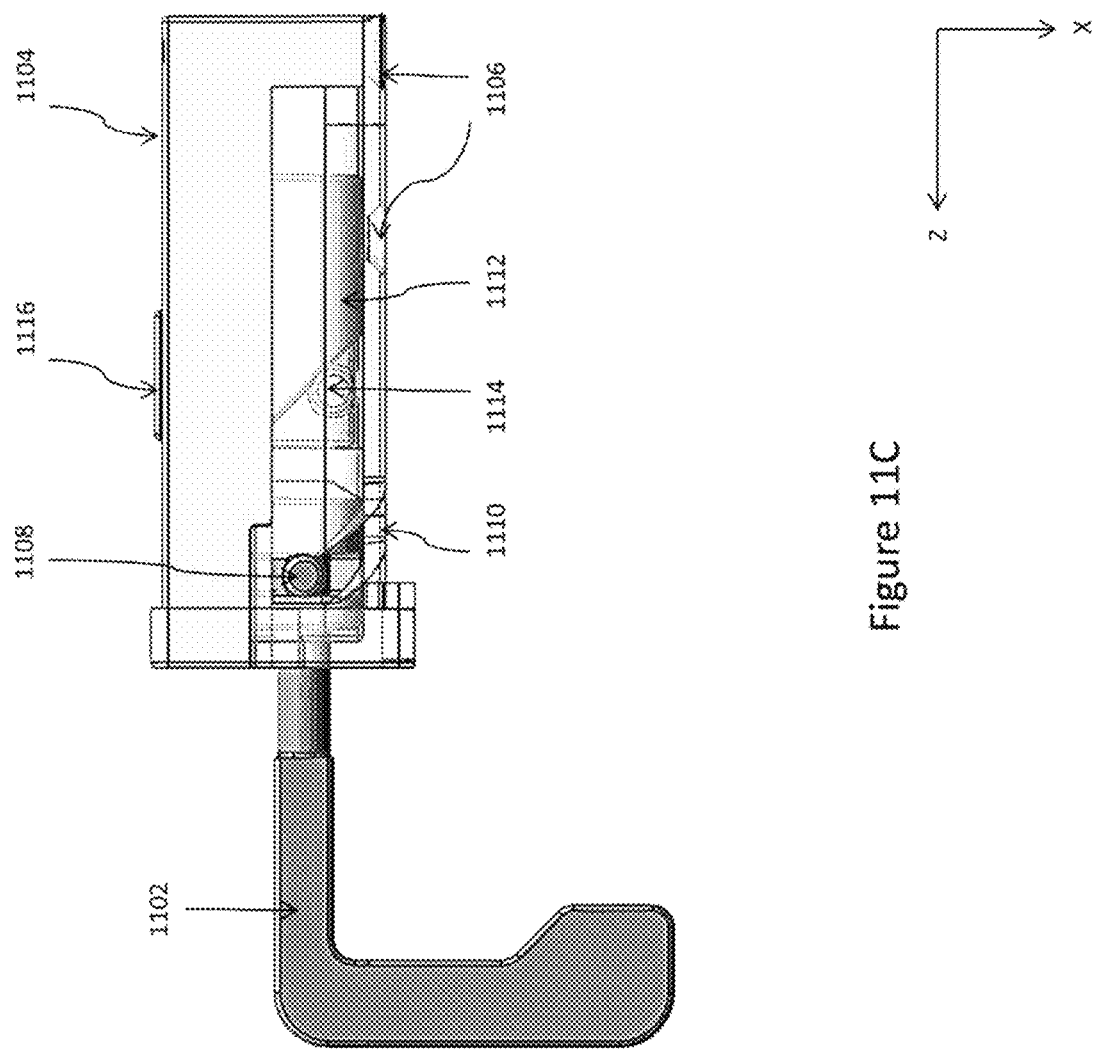
FIG. 11C shows a top view of a left-side rack attachment device in the unlocked position with a transparent surface portion to reveal internal details.

In FIGS. 11A, 11B and 11C, it is shown that handle 1102 is in a horizontal position with respect to the Y axis. In this position, pin 1108 is seated on a second portion of housing ramp 1110 (the opposite housing ramp portion as shown in FIG. 10A). As previously described, slide 1112 is coupled to the shaft of the handle via pin 1108. This allows the handle to push and pull the slide back and forth in the Z axis.

To enter this unlocked position, the handle is pulled in the Z axis towards the user and is rotated counter clockwise due to pin 1108 riding along housing ramp 1110. This motion of the shaft pulls the slide to the front portion of the housing (the opposite end of the housing portion as shown in FIG. 10A) which forces the slide ramp surface 1120 to press against pawl pins 1118. The force exerted by ramp surface 1120 pushes pawl 1116 in the X axis towards the right side of the housing. The pawl then compresses spring 1114, and is seated on a second portion near the top of slide ramp surface 1120. This action forces pawl 1116 to retract into the housing and disengage the adjacent aperture in the rack rail (not shown). To place the rack attachment device back in the locked position, the technician would simply push the handle to rotate the shaft back in the clockwise direction until pin 1108 is seated back in the first position as shown in FIG. 10A.

Figure 12A:
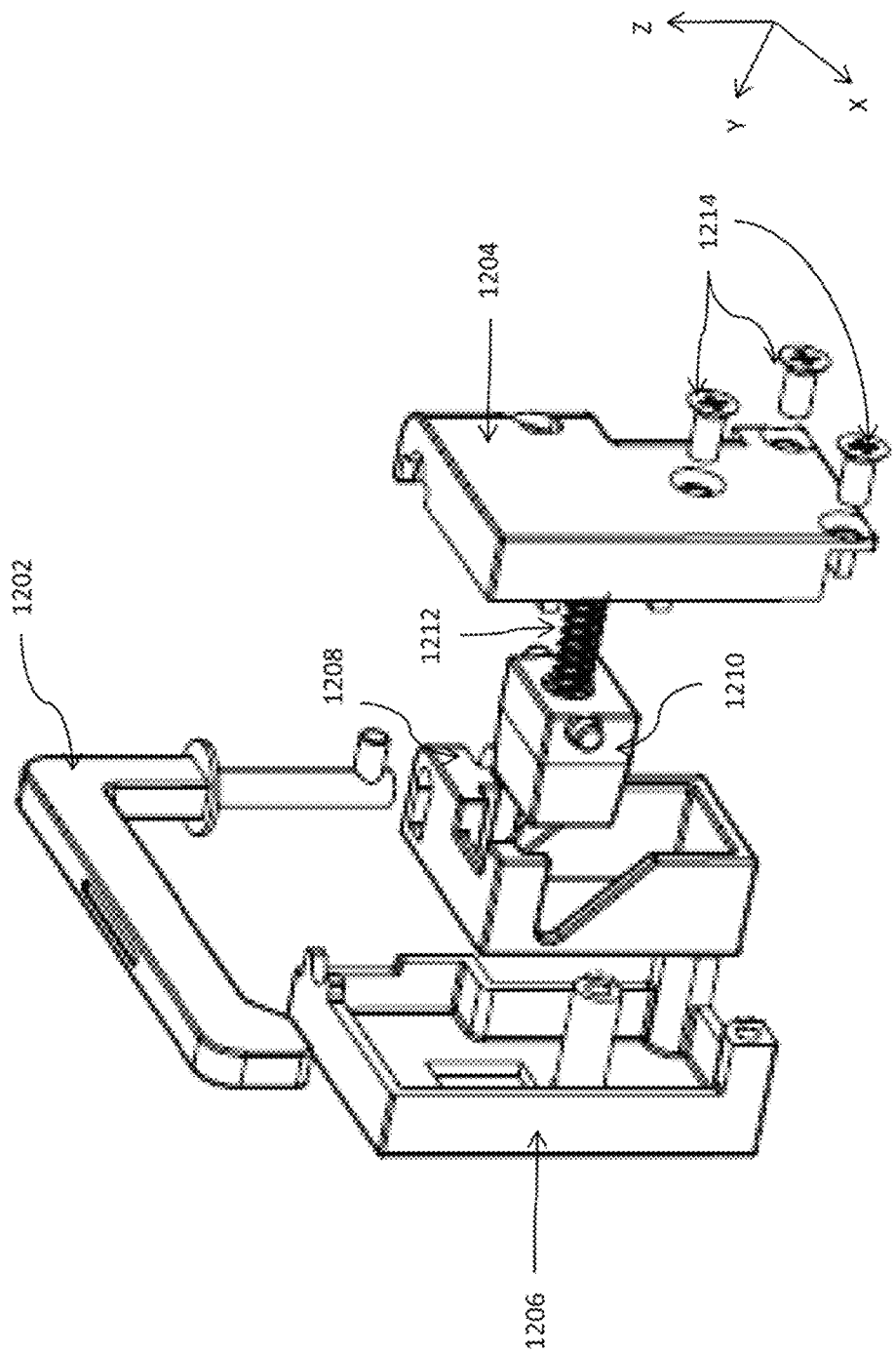
FIG. 12A shows an exploded view of another embodiment of a left-side rack attachment device.
Figure 12B:
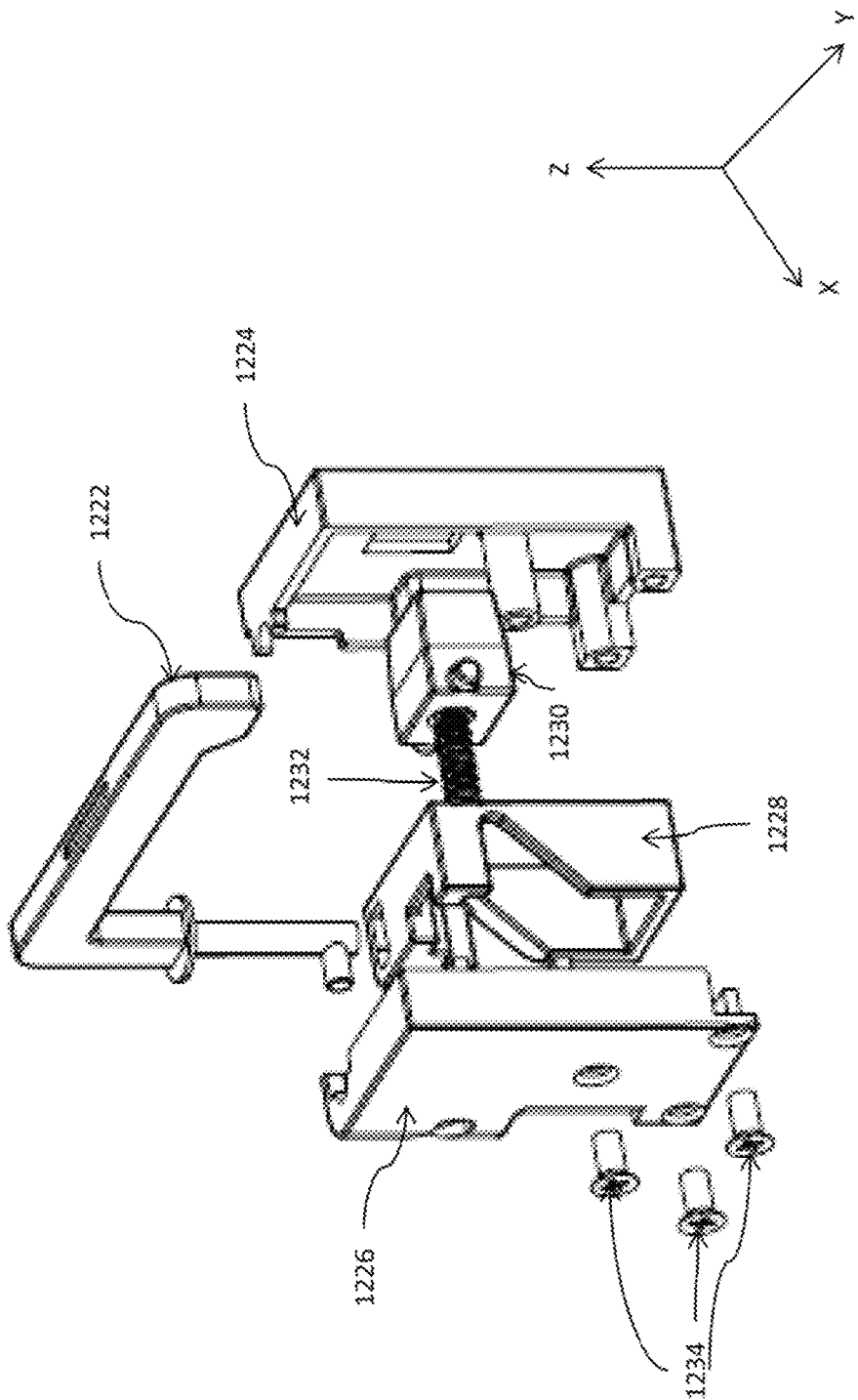
FIG. 12B shows an exploded view of another embodiment of a right-side rack attachment device.

Although FIGS. 7 and 9 show a configuration of a left-side and a right-side rack attachment device, other configuration are possible. Two such configurations (similar to 122 and 118 shown in FIG. 1A) are shown in FIGS. 12A and 12B where the handle of the rack attachment device has a different size and shape, and a notch 811 is included in the housing for clearance with other system components. For example, the left-side rack attachment device in FIG. 12A includes a handle 1202, right side housing 1204, left side housing 1206, slide 1208, pawl 1210, spring 1212 and screws 1214. Similarly, the right-side rack attachment device in FIG. 12B includes a handle 1222, right side housing 1224, left side housing 1226, slide 1228, pawl 1230 and spring 1232.

Handles 1202 and 1222 in FIGS. 12A and 12B are longer and shaped differently than the handles in FIGS. 7 and 9. Specifically, these handles extend further in the Z axis than the handles in FIGS. 7 and 9. Reasons for implementing such a handle may include, but are not limited to the size/configuration of the rack, size/configuration of the electronic device, and strength of the spring used to push the pawl into place. Other than handles 1202 and 1222, the rack attachment devices in FIGS. 12A and 12B are substantially similar and operate in substantially the same manner as those rack attachment devices in FIGS. 7 and 9 (an explanation of operation is therefore omitted).

Figure 13:
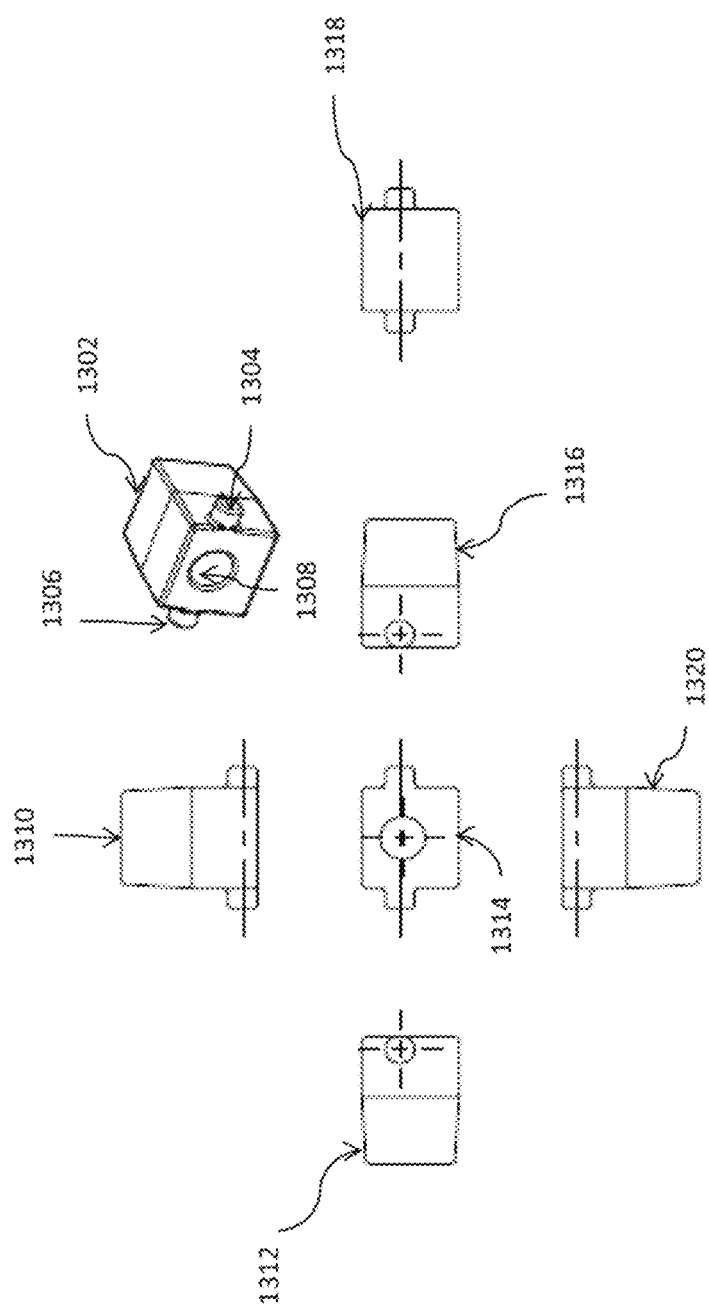
FIG. 13 shows multiple views of an embodiment of a pawl for use in the rack attachment device.

Generally, the pawl of the rack attachment device has a shape that conforms to a corresponding shape of an adjacent aperture in the rack rail. An example of such a pawl is shown in FIG. 13 which is substantially cube-shaped to fit into a slightly larger substantially cubed-shaped adjacent aperture in the rack rail. Generally, pawl 1302 includes a surface such as pins 1304 and 1306 on either side for riding along the ramp surfaces of the slide. Pawl 1302 also includes an indentation 1308 that allows an end of the spring to be properly seated on the surface of the pawl, and prevents the spring end from travelling along the surface of the pawl when in the compressed state.

Various views of the pawl 1302 are shown in FIG. 13. These views include a front side view 1310, a left side view 1312, a top view 1314, a right side view 1316, a bottom view 1318 and a back side view 1320. Pawl 1302 may be used in any of the rack attachment devices shown in the figures. It should also be noted that other pawl shapes are possible (e.g. circular, etc.), as long as they can be inserted into the aperture in the rack (e.g. substantially round pawl inserted into a substantially round hole).

Figure 14:
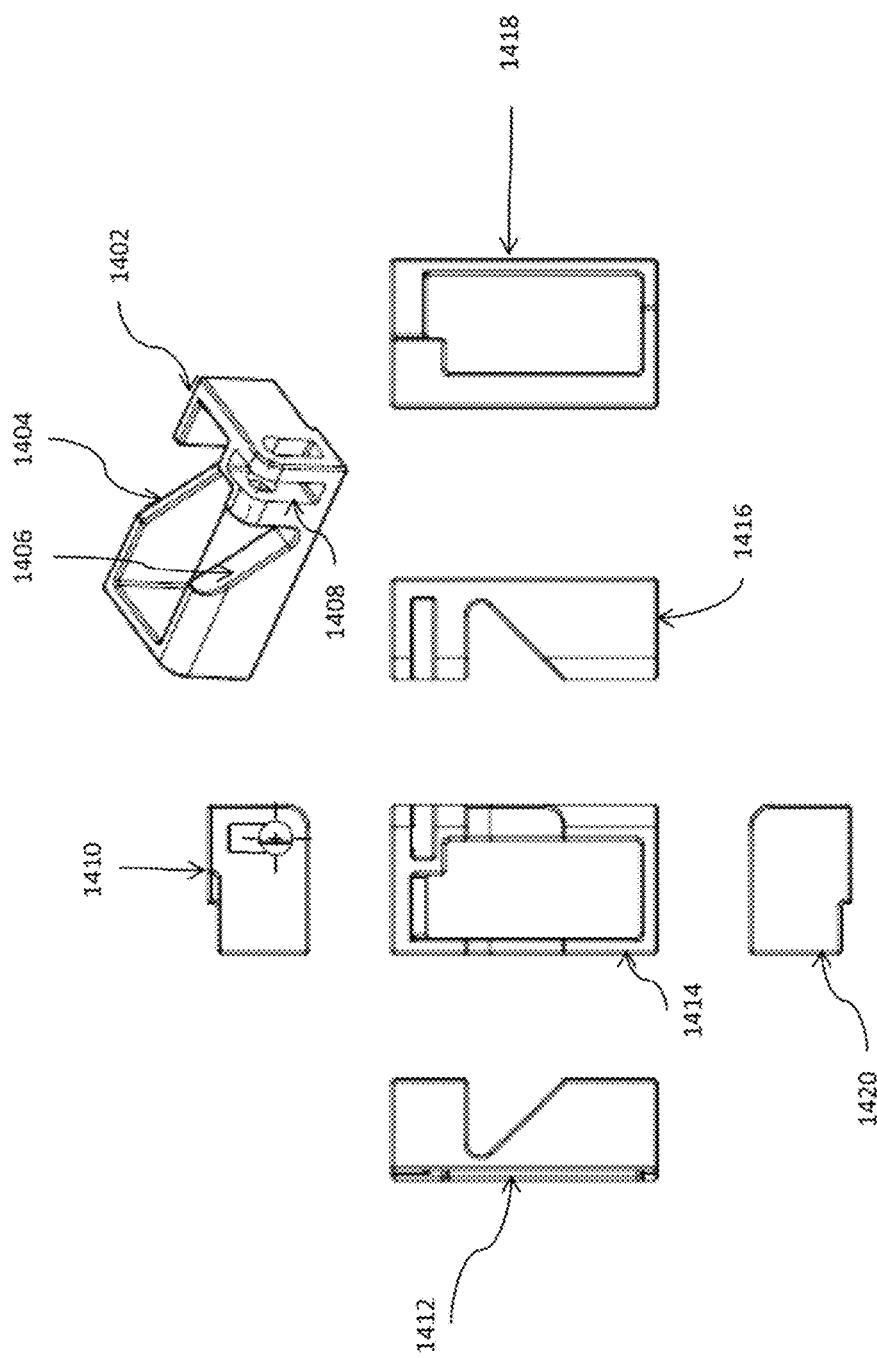
FIG. 14 shows multiple views of an embodiment of a slide for use in the rack attachment device.

FIG. 14 shows an example of a slide that may be used in the rack attachment devices. Slide 1402 shown in FIG. 14 includes ramp surfaces 1404 and 1406, and cavity 1408. As previously described, cavity 1408 is for coupling to the pin of the handle. The handle pin is able to move the slide back and forth once inserted into the cavity. The cavity also allows the pin to rotate as it rides along the housing ramp. Also as previously described, ramps 1404 and 1406 provide surfaces for the pawl pins to ride along. In the locked position, the pawl pins are seated at a bottom portion of the ramp. In contrast, in the unlocked position, the pawl pins are seated at a top portion of the ramp.

Various views of the slide 1402 are shown in FIG. 14. These views include a front side view 1410, a right side view 1412, a top view 1414, a left side view 1416, a bottom view 1418 and a back side view 1420. Slide 1402 may be used in any of the rack attachment devices shown in the figures. It should also be noted that other slide configurations are possible (e.g. slides with only one ramp for guiding the pawl; with more than two ramps for guiding the pawl; ramps with other shapes/slopes, etc.).

Figure 15A:
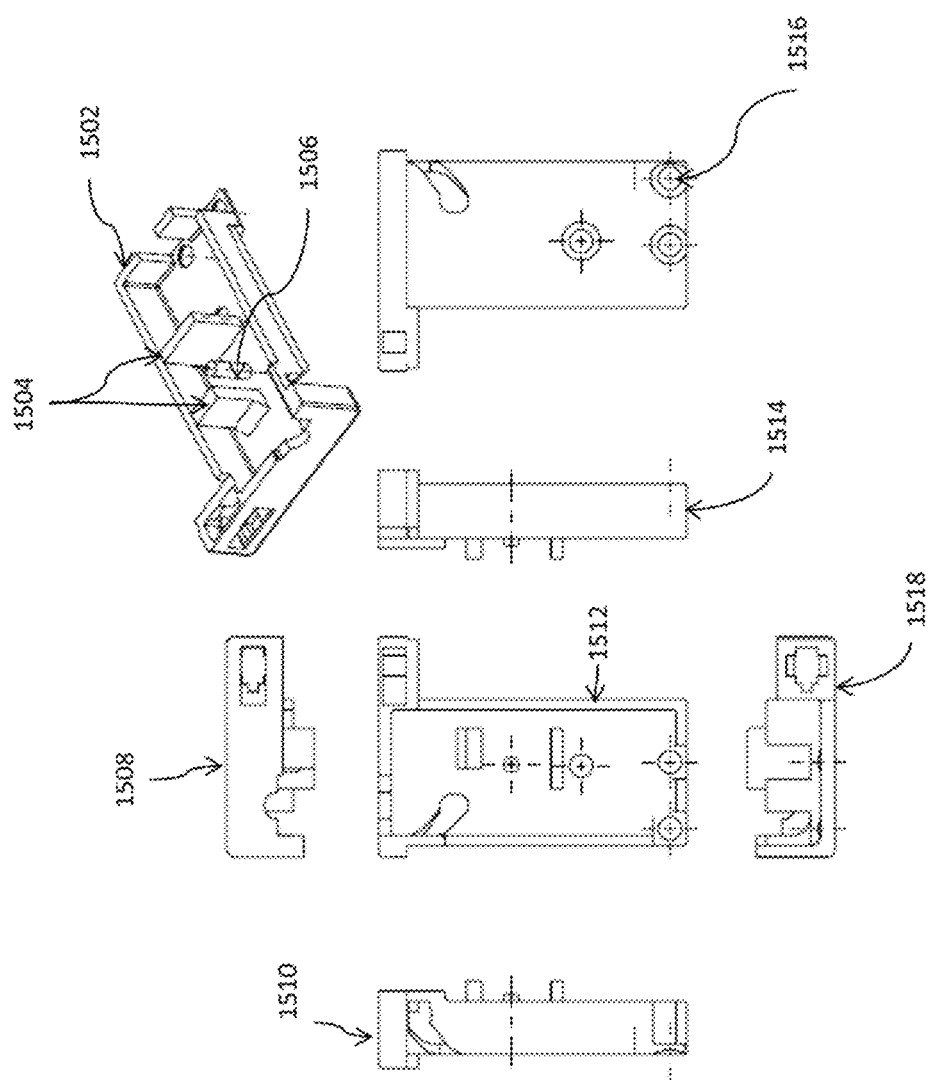
FIG. 15A shows the right side housing of an embodiment of a left-side rack attachment device.
Figure 15B:
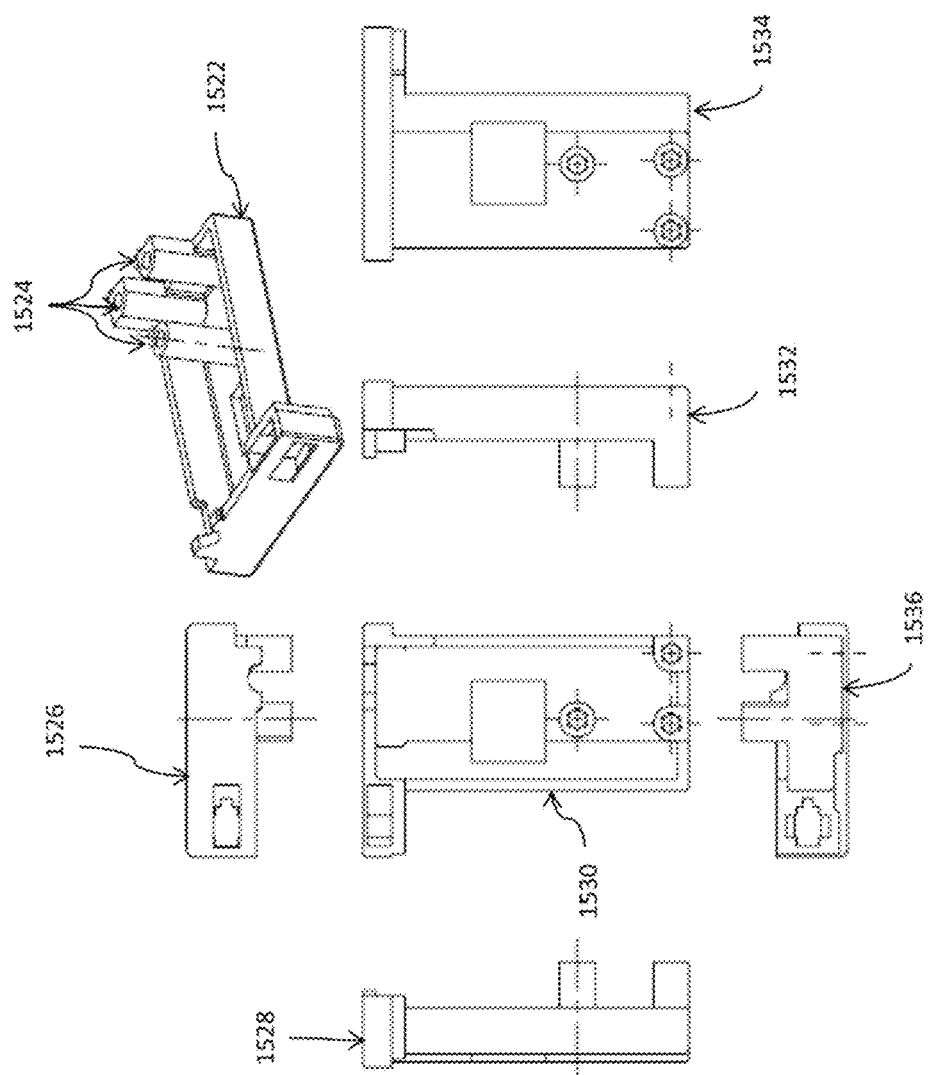
FIG. 15B shows the left side housing of the left-side rack attachment device.

Shown in FIGS. 15A and 15B are the two housing halves for a left-side rack attachment device. It is noted that a right-side rack attachment device would be similar, and description is therefore omitted. For example, FIG. 15A shows the right housing 1502 for the left-side rack attachment device. Right housing 1502 may include walls 1504 and post 1506 for adding structural integrity to the left-side rack attachment device and for guiding the slide as it moves back and forth within the housing. Various views of right housing 1502 are shown in FIG. 15A. These views include a front side view 1508, a top view 1510, a left side view 1512, a back side view 1514, a right side view 1516 and a back side view 1518.

Similarly, FIG. 15B shows the left housing 1522 for the left-side rack attachment device. Left housing 1522 includes female threaded posts 1524 for accepting screws inserted through the right housing 1502 and possibly extending through to the attached electronic device. Various views of left housing 1522 are shown in FIG. 15B. These views include a front side view 1526, a top view 1528, a right side view 1530, a back side view 1514, a bottom view 1532, a left side view 1534 and a back side view 1536.

A detailed example of a left-side rack attachment device (similar to 120 in FIG. 1A) is shown in FIGS. 6A-6E and 7. In this configuration, in order to install the device into the rack, the technician would have to place the rack attachment device into the unlocked position such that the pawl is retracted into the housing. This would allow the technician to slide the rack attachment device into the rack.

By modifying the pawl to include a ramp surface, however, the technician would not have to place the rack attachment device into the unlocked position in order to install the device. The technician can simply push the device into the rack. As the rack surface contacts the ramp surface of the pawl, this force pushes the pawl back into the housing and into the unlocked position. Once the pawl reaches the aperture in the rack rail, the technician can simply turn the handle to lock the rack attachment device in place. This is called a push-to-close rack attachment device, and is shown in FIGS. 17A-17E and 18.

As shown in FIG. 17A, the push-to-close rack attachment device includes handle 1702, housing 1704, pawl 1706 having a ramp surface, and screw holes 1710, 1712 and 1714. The push-to-close rack attachment device shown in FIG. 17A is considered a push-to-close left-side rack attachment device, because pawl 1706 protrudes from the left side of the housing relative to the handle when installed. This allows the push-to-close rack attachment device to be mounted to the left side of an electronic device (similar to 120 in FIG. 1A), such that pawl 1706 can engage an adjacent aperture on the left side rack rail 110 of the computer rack.

Additional views of this push-to-close left-side rack attachment device are shown in FIG. 17B (left side view), FIG. 17C (bottom view in locked position), FIG. 17D (bottom view in unlocked position) and FIG. 17E (right side view). It should be noted that the right side view shown in FIG. 17E also shows housing ramp 1708 and screws 1716, 1718 and 1720.

For further clarity, FIG. 18 shows an exploded view of the push-to-close left-side rack attachment device. Coordinates have been provided to aid in explanation. Generally, the push-to-close rack attachment device includes a housing split into multiple portions such as two halves 1810 and 1812. The housing halves are fastened together by screws 1822, 1824 and 1826 which are inserted into holes on 1812 and extend through the housing in the X axis to mate with female threaded posts 1816, 1818 and 1820. These screws may also extend through housing 1810 to be attached to the external housing of an electronic device having female threaded holes. The internal mechanism of the push-to-close rack attachment device includes slide 1814, pawl 1806 and spring 1808.

In general, a substantially flat bottom surface of slide 1814 is seated on a substantially flat inner surface of housing 1810. Pawl 1806 in this example is cube shaped and includes a protruding surface (e.g. pins 1807) that ride along ramps 1813 of the slide, and a ramp surface 1707 that comes into contact with the rack during installation. Spring 1808 is a metal spring or the like that resists compression. When the two housing halves are secured together with the screws, spring 1808 is compressed between a top surface of pawl 1806 and an inner surface of housing 1812.

Handle 1802 includes a shaft 1803 that extends in a handle axis Z. Shaft 1803 includes a surface (e.g. pin 1804) that protrudes from the shaft in a pin axis X which is at an angle to handle axis Z. In order to operate the rack attachment device, shaft 1803 including pin 1804 are housed in cavity 1815 formed in slide 1814. When the push-to-close rack attachment device is assembled, pin 1804 abuts at least two surfaces cavity 1815 of slide 1814, and also abuts a ramp cutout from housing 1812 (e.g. housing ramp 1608). This allows the handle to be moved in and out of the push-to-close rack attachment device in the Z axis, thereby moving the slide back and forth in the Z axis.

Generally, when the slide moves back and forth in the Z axis, pins 1807 on pawl 1806 ride along the surfaces of slide ramps 1813. When the pins 1807 are in contact with bottom portion of the ramps 1813 closer to housing portion 1810, the pawl protrudes from the housing and the rack attachment device is in the locked position. When the pins 1807, however, are in contact with top portion of the ramps 1813 closer to housing portion 1812, the pawl is retracted into the housing and the rack attachment device is in the unlocked position.

The push-to-close rack attachment device uses the ramp surface 1707 of the pawl to make installation easier. For example, when the technician decides to install the push-to-close rack attachment device, the technician does not have to position the push-to-close rack attachment device in the unlocked position (e.g. the push-to-close rack attachment device can remain in the locked position during installation). The technician simply pushes the push-to-close rack attachment device into the rack. When the ramp surface 1707 of the pawl contacts the side of the rack (e.g. the surface of rack rail 110), the resultant force pushes the pawl back into the housing of the push-to-close rack attachment device and forces the handle into the unlocked position. Once the push-to-close rack attachment device is inserted into the rack, the technician simply turns the handle to place the push-to-close rack attachment device into the locked position, thereby completing the installation process.

Figure 16:
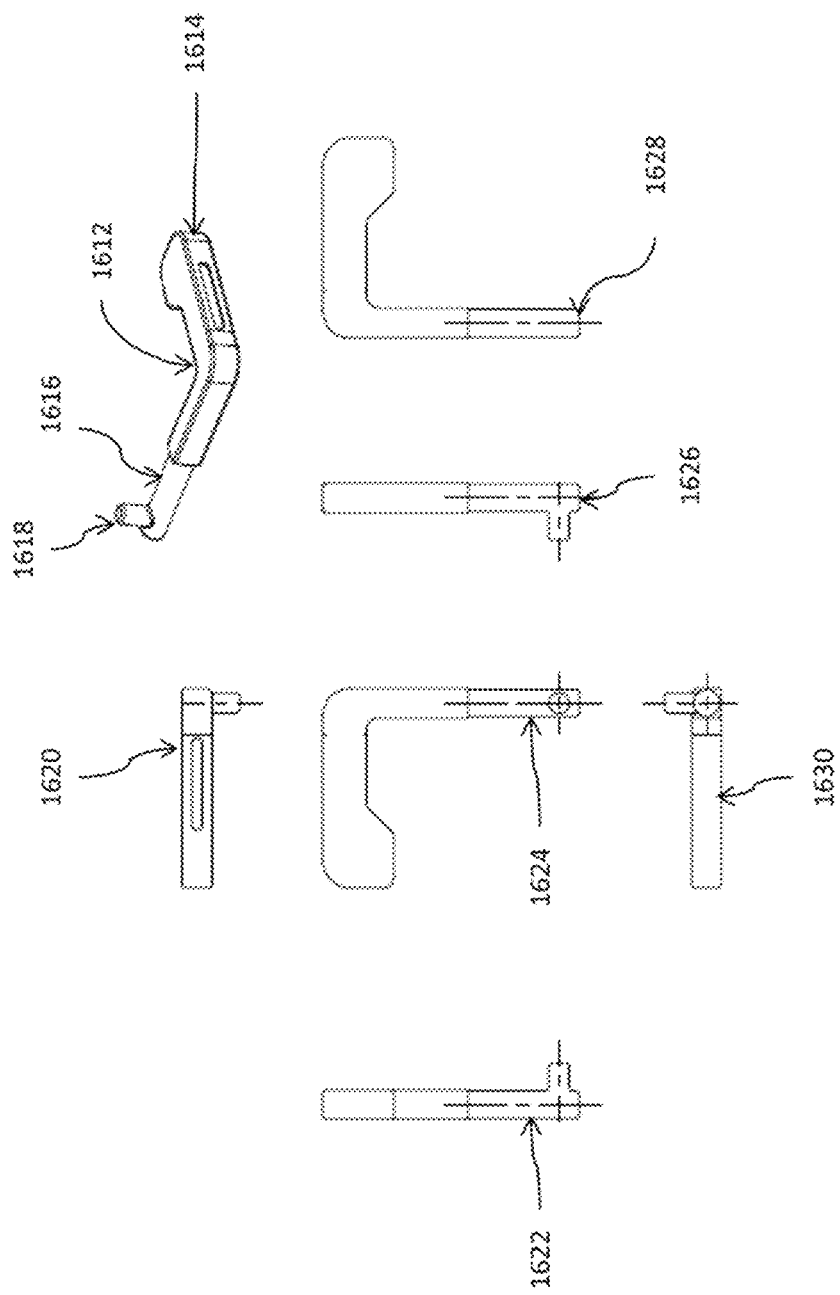
FIG. 16 shows multiple views of a handle for use in the rack attachment device.

As previously described, the handle for the rack attachment device may take many sizes and shapes. One example of such a handle is shown as handle 1612 in FIG. 16. Handle 1612 includes a gripping portion 1614 that is designed to be gripped by a hand (e.g. human hand), shaft 1616 for extending into the rack attachment device, and pin 1618 for coupling to the slide. Various views of handle 1612 are shown in FIG. 16. These views include front view 1620, top view 1622, right side view 1624, top view 1626, left side view 1628 and back view 1630.

Figure 19:
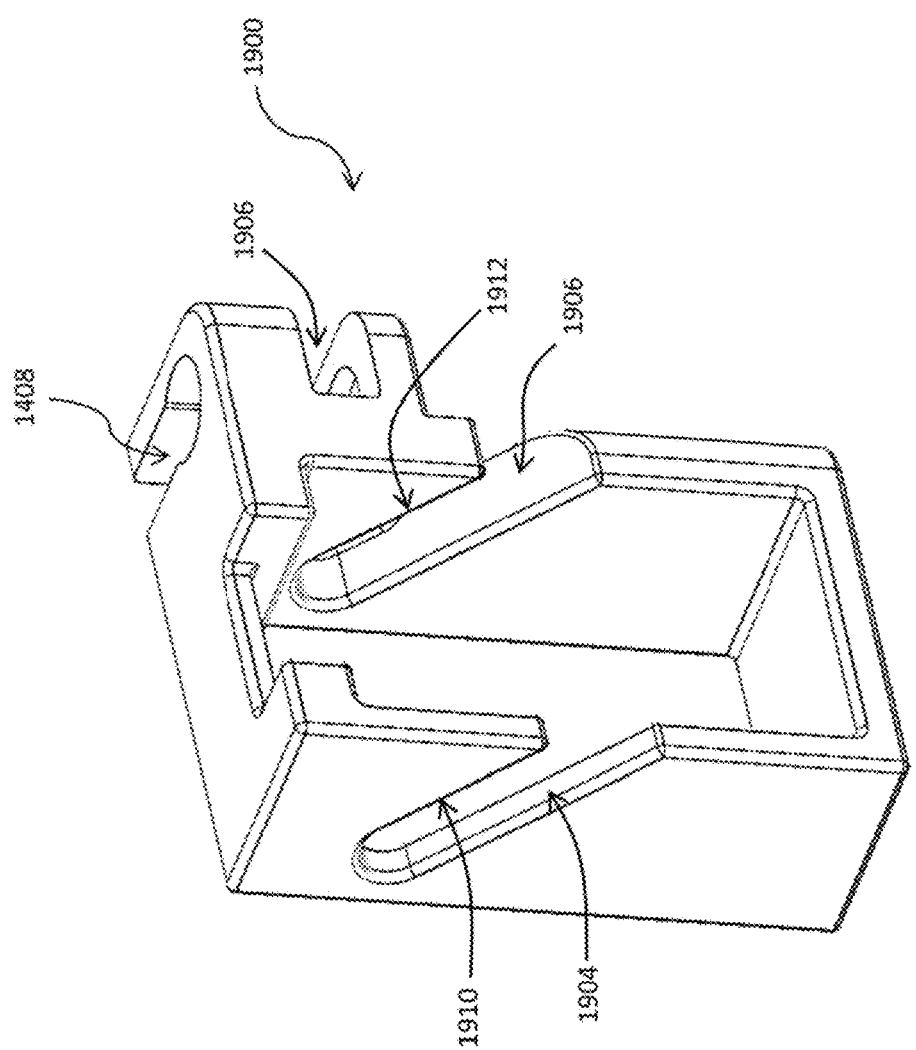
FIG. 19 shows an isometric view of an alternative embodiment of a slide for use in the rack attachment device.

FIG. 19 shows another example of a slide 1902 that may be used in the rack attachment devices. Slide 1902 may, in many respects, be the same or similar to slide 1402 or other slides described herein. For example, slide 1902 includes one or more retraction ramp surfaces 1904, 1906 corresponding to the ramp surfaces 1404 and 1406 of slide 1402, and a cavity 1908 corresponding to cavity 1408 of slide 1402. As previously described, ramp surface 1904 and 1906 are configured to engage the pawl pins (e.g., pawl pins 1118) to force the pawl (e.g., pawl 1116) into the retracted position when the handle (e.g., handle 1102) is moved to the unlocked position (see, e.g., FIGS. 11A-11C). The cavity 1908 is configured to retain the pin (e.g., pin 1108) of the handle such that movement of the handle pin causes a corresponding movement of the slide 1908, such as discussed above.

Slide 1902 also includes one or more extension ramp surfaces 1910, 1912 that are configured to abut the pawl to drive the pawl into the extended position. For example each retraction ramp surface 1904, 1906 may have a corresponding extension ramp surface 1910, 1912, to thereby form a slot between each retraction ramp surface 1904, 1906 and its corresponding extension ramp surface 1910, 1912. Each pawl pin (e.g., pawl pins 1118) is dimensioned to fit within a corresponding one of the slots. Thus, movement of the slide 1902 from the unlocked position to the locked position causes the extension ramp surfaces 1910, 1912 to press on the corresponding pawl pin to generate a force to move the pawl from the retracted position to the extended position.

This embodiment provides a positive locking mechanism that forces the pawl into the locked position, which can help prevent situations in which the rack attachment device is erroneously believed to be in the locked condition. For example, if the pawl is not properly aligned with a corresponding rack aperture, then contact between the pawl and the rack will prevent a user from turning the handle from the unlocked position to the locked position. More specifically, as the user attempts to rotate the handle to the locked position, the extension ramp surfaces 1910, 1912 will press on the pawl pins, but the pawl will not be able to fully extend and contact between the pawl and the rack will resist movement of the handle to locked position. The same is true if the rack aperture is obstructed, if the pawl is blocked by debris in the housing, if the pawl jams within the housing, and so on.

The embodiment of FIG. 19 also provides a benefit in that it prevents the pawl from retracting into the housing unless the handle is moved to the unlocked condition. For example, if the pawl is properly engaged with a rack aperture to secure the electronic device, contact between the pawl and the extension ramp surfaces 1910, 1912 prevents the pawl from being retracted out of the rack aperture unless the handle is also moved to the unlocked position. This can provide an added measure of safety by helping prevent Inadvertent release of the pawl by contact with objects that might be located next to the rack (e.g., movement of an adjacent rack cannot bump the pawl and cause it to disengage).

Slide 1902 may be interchangeable with the other slides discussed herein (e.g., provided as an alternative slide for use with the other parts, with little or no modification to the other parts). It will also be understood that one or more extension ramp surfaces 1910, 1912 may be added to the other slides described herein. Other alternatives and variations will be apparent to persons of ordinary skill in the art in view of the present disclosure.

It is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A rack attachment apparatus configured for attaching an electronic device to a rack, the rack attachment apparatus comprising:
    a housing;
    a pawl at least partially enclosed by the housing and mounted for movement relative to the housing along a pawl axis between an extended pawl position and a retracted pawl position, an end portion of the pawl being sized to extend further from the housing when the pawl is in the extended pawl position than when the pawl is in the retracted pawl position;
    a slide at least partially enclosed by the housing and mounted for movement relative to the housing along a slide axis angled relative to the pawl axis between a first slide position and a second slide position, wherein the slide has a retraction slide surface that is configured to engage the pawl to hold the pawl in the retracted pawl position when the slide is in the first slide position, and to allow the pawl to move to the extended pawl position when the slide is in the second slide position; and
    a handle extending from the housing and coupled to the slide, the handle being movable relative to the housing between a first handle position in which the handle holds the slide in the first slide position, and a second handle position in which the handle holds the slide in the second slide position.

2. The rack attachment apparatus of claim 1, wherein the pawl includes at least one pawl surface extending at an angle relative to the pawl axis and positioned for contacting the retraction slide surface.

3. The rack attachment apparatus of claim 2, wherein:
    the retraction slide surface includes at least one retraction slide ramp including a first retraction slide ramp portion and a second retraction slide ramp portion,
    the first retraction slide ramp portion contacts the pawl surface when the slide is in the first slide position and prevents the pawl from moving from the retracted pawl position to the extended pawl position, and
    the second retraction slide ramp portion contacts the pawl surface when the slide is in the second slide position and permits the pawl to move from the retracted pawl position to the extended pawl position.

4. The rack attachment apparatus of claim 1, wherein:
the handle includes a shaft extending along a handle axis into the housing, and
the shaft includes a shaft surface extending at an angle relative to the handle axis and positioned for contacting the slide.

5. The rack attachment apparatus of claim 4, wherein:
the housing includes a housing ramp surface defined in the housing, the housing ramp surface including a first housing ramp portion and a second housing ramp portion,
the first housing ramp portion contacts the shaft surface when the slide is in the first slide position to prevent the pawl from moving from the retracted pawl position to the extended pawl position, and
the second housing ramp portion contacts the shaft surface when the slide is in the second slide position to permit the pawl to move from the retracted pawl position to the extended pawl position.

6. The rack attachment apparatus of claim 4, wherein the shaft surface is coupled to a slide cavity defined in the slide, a surface of the slide cavity abutting the shaft surface to translate movement of the shaft to movement of the slide.

7. The rack attachment apparatus of claim 1, further comprising:
a spring having a first spring end portion in contact with a surface of the pawl, and a second spring end portion in contact with a surface of the housing,
wherein the spring is positioned to apply force to move the pawl from the retracted pawl position to the extended pawl position when the slide is in the second slide position.

8. The rack attachment apparatus of claim 1, wherein the slide further comprises an extension slide surface configured to move the pawl from the retracted pawl position to the extended pawl position when the slide is moved from the first slide position to the second slide position.

9. The rack attachment apparatus of claim 8, wherein the extension slide surface faces the retraction slide surface to form a slot therebetween, the slot being sized to slidingly receive a portion of the pawl.

10. The rack attachment apparatus of claim 1, further comprising a mounting bracket extending from the housing and configured to contact a surface of an electronic device when the rack attachment apparatus is inserted into the electronic device, the mounting bracket being configured for attachment to the surface of the electronic device.

11. The rack attachment apparatus of claim 1, wherein the pawl is substantially rectangular in cross-sectional shape and is configured to extend into a rack aperture defined in a rack.

12. The rack attachment apparatus of claim 1, wherein:
the housing includes two housing portions at least partially defining an interior region, and
the slide, the pawl, and the handle shaft are mounted to extend within the interior region in between the two portions of the housing when the two housing portions are coupled together.

13. The rack attachment apparatus of claim 1, wherein the pawl includes a push-to-close ramp surface for contacting a rack surface during installation of the rack attachment apparatus when in the locked position, the rack surface exerting a force on the push-to-close ramp surface to push the pawl into the unlocked position.

14. A computer rack system, including:
a computer rack having at least one shelf for supporting electronic devices; and
a rack attachment apparatus connected to at least one of the electronic devices and seated on at least one shelf of the computer rack, the rack attachment apparatus including:
a housing configured for coupling to the electronic device;
a pawl at least partially enclosed by the housing and mounted for movement relative to the housing along a pawl axis between an extended pawl position and a retracted pawl position, an end portion of the pawl being sized to extend into a rack aperture defined in the rack when the pawl is in the extended pawl position;
a slide at least partially enclosed by the housing and mounted for movement relative to the housing along a slide axis angled relative to the pawl axis between a first slide position and a second slide position, wherein the slide has a retraction slide surface that is configured to engage the pawl to hold the pawl in the retracted pawl position when the slide is in the first slide position, and to allow the pawl to move to the extended pawl position when the slide is in the second slide position; and
a handle extending from the housing and coupled to the slide, the handle being movable relative to the housing between a first handle position in which the handle holds the slide in the first slide position, and a second handle position in which the handle holds the slide in the second slide position.

15. The computer rack system of claim 14, wherein the pawl includes at least one pawl surface extending at an angle relative to the pawl axis and positioned for contacting the retraction slide surface.

16. The computer rack system of claim 15, wherein:
the retraction slide surface includes at least one retraction slide ramp including a first retraction slide ramp portion and a second retraction slide ramp portion,
the first retraction slide ramp portion contacts the pawl surface when the slide is in the first slide position and prevents the pawl from moving along the pawl axis toward the rack aperture defined in the rack, and
the second retraction slide ramp portion contacts the pawl surface when the slide is in the second slide position and permits the pawl to enter the rack aperture defined in the rack.

17. The computer rack system of claim 14, wherein the handle includes a shaft extending along a handle axis into the housing, and the shaft includes a shaft surface extending at an angle relative to the handle axis and positioned for contacting the slide.

18. The computer rack system of claim 17, wherein:
the housing includes a housing ramp surface defined in the housing, the housing ramp surface including a first housing ramp portion and a second housing ramp portion,
the first housing ramp portion contacts the shaft surface when the slide is in the first slide position to prevent the pawl from moving along the pawl axis toward the rack aperture defined in the rack, and
the second housing ramp portion contacts the shaft surface when the slide is in the second slide position to permit the pawl to move along the pawl axis toward the rack aperture defined in the rack.

19. The computer rack system of claim 17, wherein the shaft surface is coupled to a slide cavity defined in the slide, a surface of the slide cavity abutting the shaft surface to translate movement of the shaft to movement of the slide.

20. The computer rack system of claim 14, further comprising:
    a spring having a first spring end portion in contact with a surface of the pawl, and a second spring end portion in contact with a surface of the housing,
    wherein the spring is positioned to apply force to move the pawl along the pawl axis toward the rack aperture defined in the rack, when the slide is in the second slide position.

21. The rack attachment apparatus of claim 14, wherein the slide further comprises an extension slide surface configured to move the pawl from the retracted pawl position to the extended pawl position when the slide is moved from the first slide position to the second slide position.

22. The rack attachment apparatus of claim 21, wherein the extension slide surface faces the retraction slide surface to form a slot therebetween, the slot being sized to slidingly receive a portion of the pawl.

23. The computer rack system of claim 14, further comprising a mounting bracket extending from the housing and configured to contact a surface of the electronic device when the rack attachment apparatus is inserted into the electronic device, the mounting bracket being configured for attachment to the surface of the electronic device.

24. The computer rack system of claim 14, wherein the pawl is substantially rectangular in cross-sectional shape and is configured to extend into the rack aperture defined in the rack.

25. The computer rack system of claim 14, wherein the housing includes two housing portions at least partially defining an interior region, and the slide, the pawl, and the handle shaft are mounted to extend within the interior region in between the two portions of the housing when the two housing portions are coupled together.

26. The computer rack system of claim 14, wherein the pawl includes a push-to-close ramp surface for contacting a rack surface during installation of the rack attachment apparatus when in the locked position, the rack surface exerting a force on the push-to-close ramp surface to push the pawl into the unlocked position.

* * * * *